(12) United States Patent
Lim

(10) Patent No.: US 11,367,819 B2
(45) Date of Patent: Jun. 21, 2022

(54) LIGHT-EMITTING DEVICE ARRAY AND LIGHT-EMITTING APPARATUS INCLUDING LIGHT-EMITTING DEVICE ARRAY

(71) Applicant: SUZHOU LEKIN SEMICONDUCTOR CO., LTD., Taicang (CN)

(72) Inventor: Woo Sik Lim, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 490 days.

(21) Appl. No.: 15/506,551

(22) PCT Filed: Jul. 16, 2015

(86) PCT No.: PCT/KR2015/007393
§ 371 (c)(1),
(2) Date: Feb. 24, 2017

(87) PCT Pub. No.: WO2016/032123
PCT Pub. Date: Mar. 3, 2016

(65) Prior Publication Data
US 2017/0256694 A1 Sep. 7, 2017

(30) Foreign Application Priority Data

Aug. 26, 2014 (KR) .................. 10-2014-0111388

(51) Int. Cl.
*H01L 33/62* (2010.01)
*H01L 27/15* (2006.01)
(Continued)

(52) U.S. Cl.
CPC .......... *H01L 33/62* (2013.01); *H01L 25/0753* (2013.01); *H01L 27/153* (2013.01);
(Continued)

(58) Field of Classification Search
None
See application file for complete search history.

(56) References Cited

U.S. PATENT DOCUMENTS

2008/0173884 A1 7/2008 Chitnis et al.
2011/0215358 A1* 9/2011 Hwang .................. H01L 27/15
257/98
(Continued)

FOREIGN PATENT DOCUMENTS

JP 2002-335010 A 11/2002
JP 2006-73979 A 3/2006
(Continued)

OTHER PUBLICATIONS

International Search Report (with English Translation) and Written Opinion dated Sep. 25, 2015 issued in Application No. PCT/KR2015/007393.

(Continued)

*Primary Examiner* — Vincent Wall
(74) *Attorney, Agent, or Firm* — Birch, Stewart, Kolasch & Birch, LLP

(57) ABSTRACT

A light-emitting device array according to an embodiment includes a plurality of light-emitting devices connected to each other, each of the light-emitting devices comprising a light-emitting structure comprising a first conductive semiconductor layer, an active layer, and a second conductive semiconductor layer; a (1-1)th electrode connected to the exposed first conductive semiconductor layer; a (1-2)th electrode connected to the second conductive semiconductor layer; (2-1)th and (2-2)th electrodes connected to the (1-1)th and (1-2)th electrodes, respectively; a first bonding layer disposed between the (1-1)th electrode and the (2-1)th electrode; and a second bonding layer disposed between the (1-2)th electrode and the (2-2)th electrode wherein the (2-1)th electrode of the first light-emitting device and the (Continued)

(2-2)th electrode of the second light-emitting device are integrated, and the (2-2)th electrode of the first light-emitting device and the (2-1)th electrode of the second light-emitting device are integrated.

12 Claims, 20 Drawing Sheets

(51) Int. Cl.
| | |
|---|---|
| H01L 33/00 | (2010.01) |
| H01L 25/075 | (2006.01) |
| H01L 33/06 | (2010.01) |
| H01L 33/22 | (2010.01) |
| H01L 33/30 | (2010.01) |
| H01L 33/32 | (2010.01) |
| H01L 33/40 | (2010.01) |
| H01L 33/42 | (2010.01) |
| H01L 33/44 | (2010.01) |
| H01L 33/50 | (2010.01) |
| H01L 33/56 | (2010.01) |
| H01L 33/38 | (2010.01) |

(52) U.S. Cl.
CPC .......... *H01L 33/0093* (2020.05); *H01L 33/06* (2013.01); *H01L 33/22* (2013.01); *H01L 33/30* (2013.01); *H01L 33/32* (2013.01); *H01L 33/405* (2013.01); *H01L 33/42* (2013.01); *H01L 33/44* (2013.01); *H01L 33/502* (2013.01); *H01L 33/56* (2013.01); *H01L 33/382* (2013.01); *H01L 2224/16245* (2013.01); *H01L 2933/005* (2013.01); *H01L 2933/0025* (2013.01); *H01L 2933/0041* (2013.01); *H01L 2933/0066* (2013.01)

(56) References Cited

U.S. PATENT DOCUMENTS

| | | | | |
|---|---|---|---|---|
| 2013/0193453 | A1* | 8/2013 | Donofrio | ............ H01L 25/0753 |
| | | | | 257/88 |
| 2015/0318444 | A1* | 11/2015 | Huang | ................ H01L 25/0753 |
| | | | | 257/99 |

FOREIGN PATENT DOCUMENTS

| | | |
|---|---|---|
| JP | 2007-123613 | 5/2007 |
| JP | 2008-263246 | 10/2008 |
| KR | 10-1999-0009568 | 2/1999 |
| KR | 10-2005-0074491 A | 7/2005 |
| KR | 10-2009-0032207 | 4/2009 |
| KR | 10-2009-0071622 | 7/2009 |
| KR | 10-2011-0127056 A | 11/2011 |
| KR | 10-2012-0031343 A | 4/2012 |
| KR | 10-2012-0132212 | 12/2012 |
| KR | 10-2013-0007126 | 1/2013 |
| KR | 10-2014-0032794 | 3/2014 |

OTHER PUBLICATIONS

Korean Office Action dated Jul. 15, 2020 issued in Application 10-2014-0111388.

* cited by examiner

[FIG. 1]
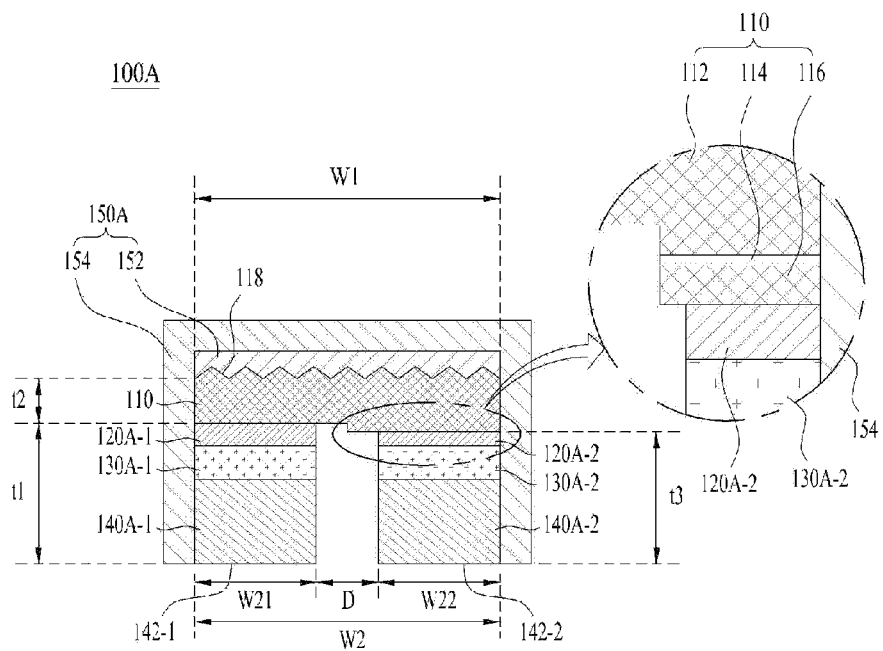
[FIG. 2]
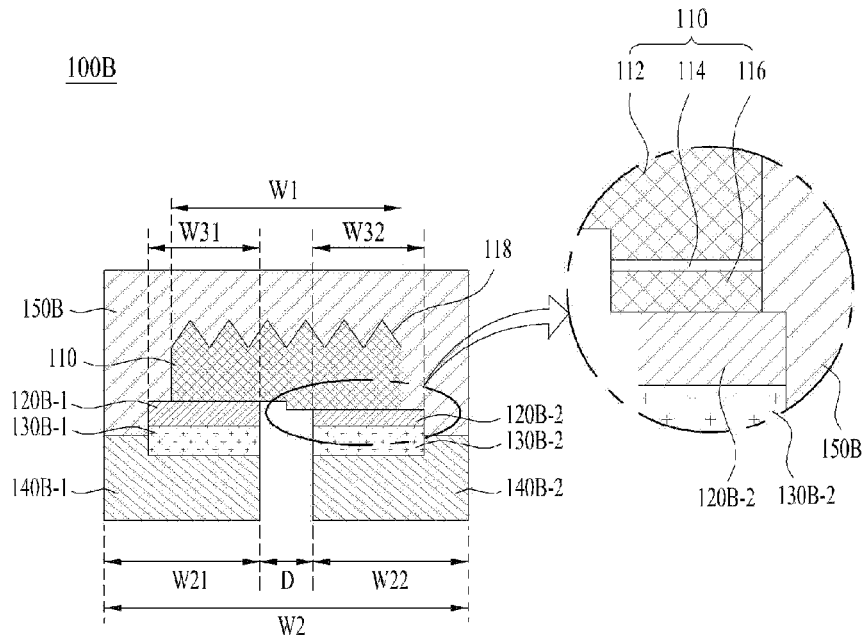

[FIG. 3]
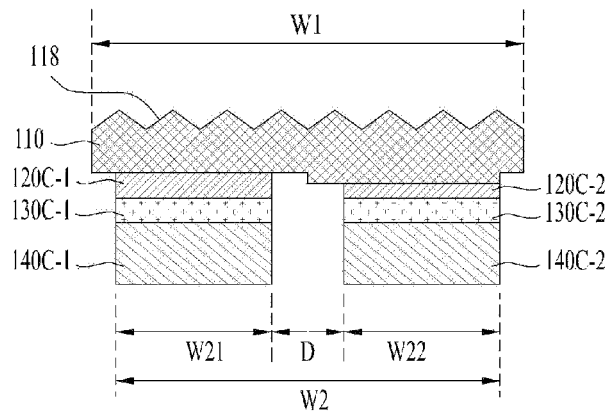
[FIG. 4]
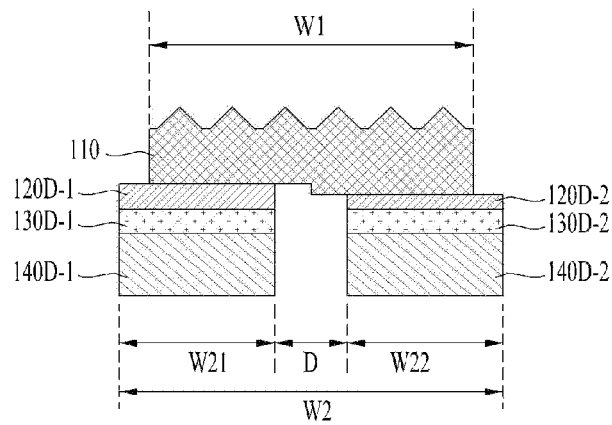
[FIG. 5]
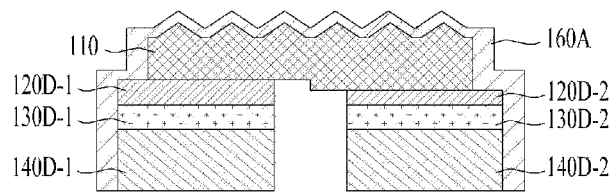

【FIG. 6】
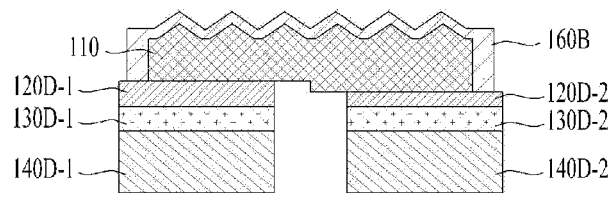
【FIG. 7】
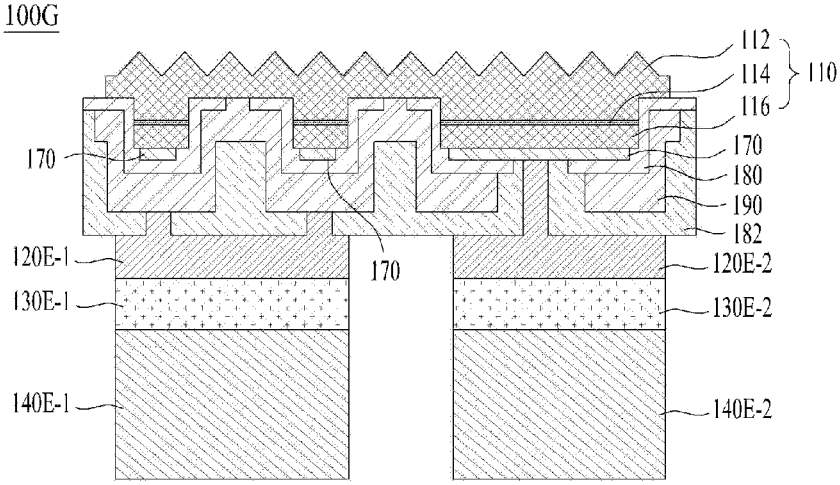
【FIG. 8】
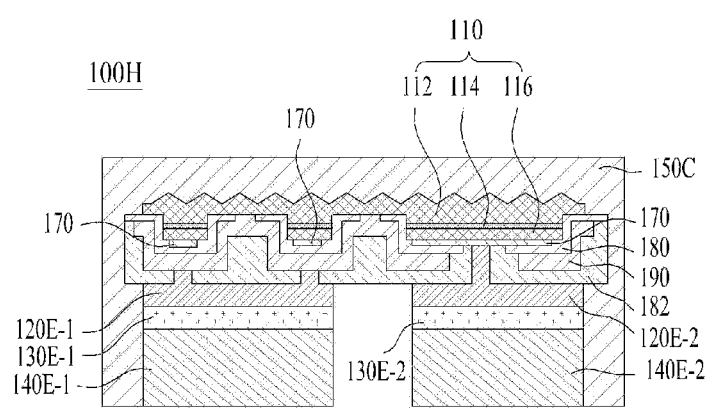

[FIG. 9]
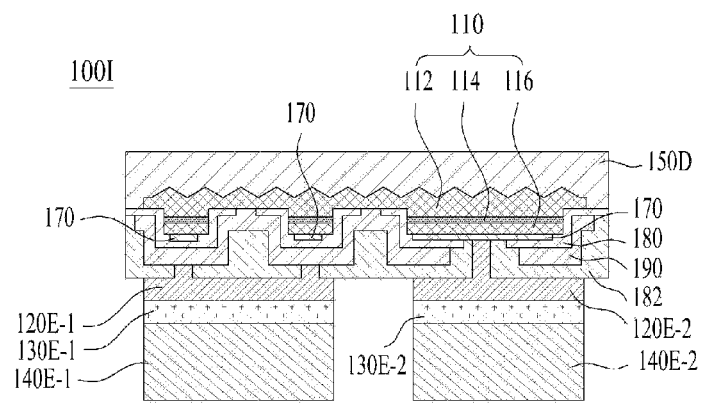
[FIG. 10]
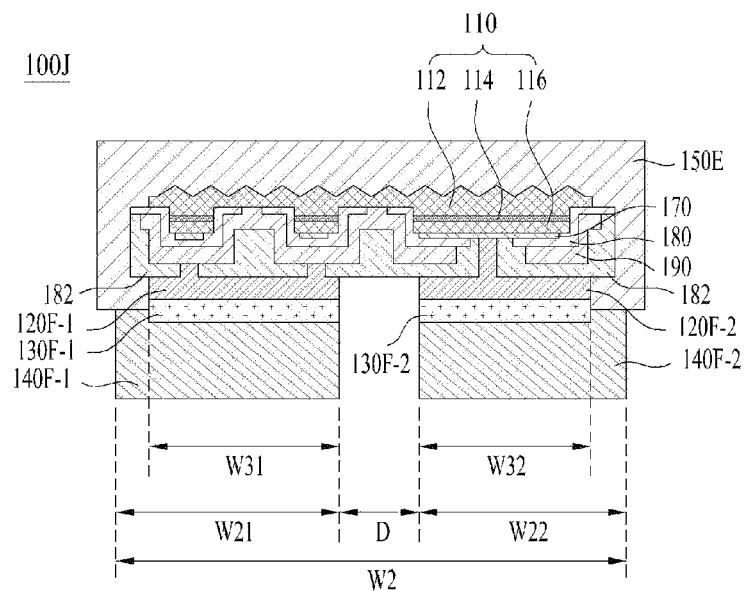

[FIG. 11]
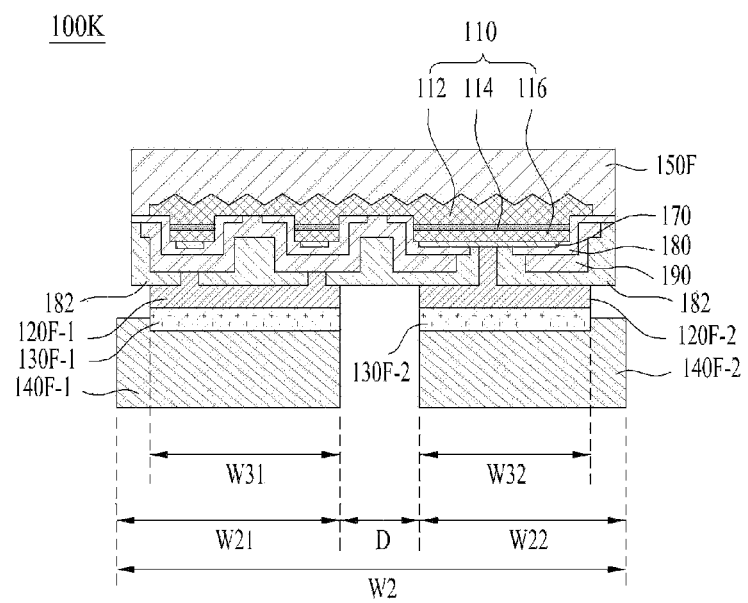
[FIG. 12]
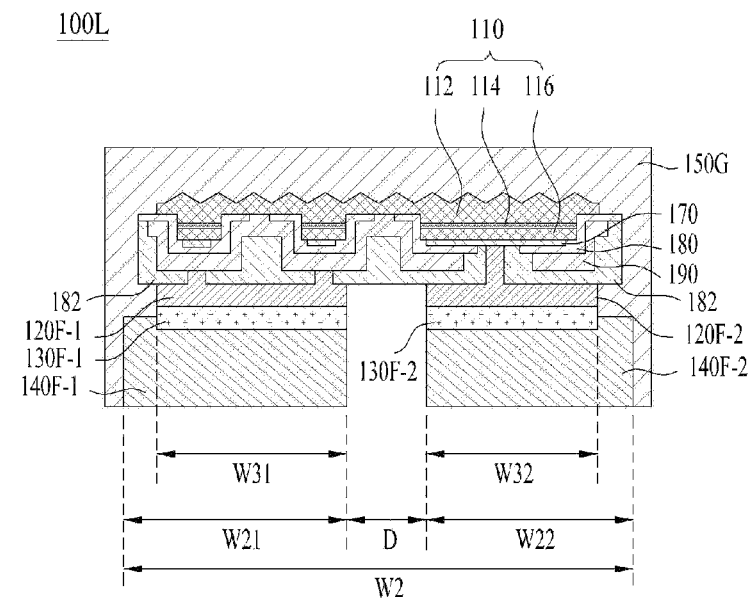

【FIG. 13a】
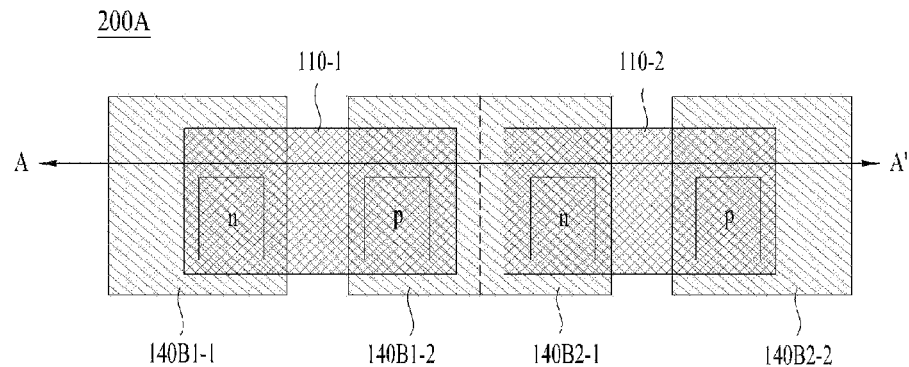
【FIG. 13b】
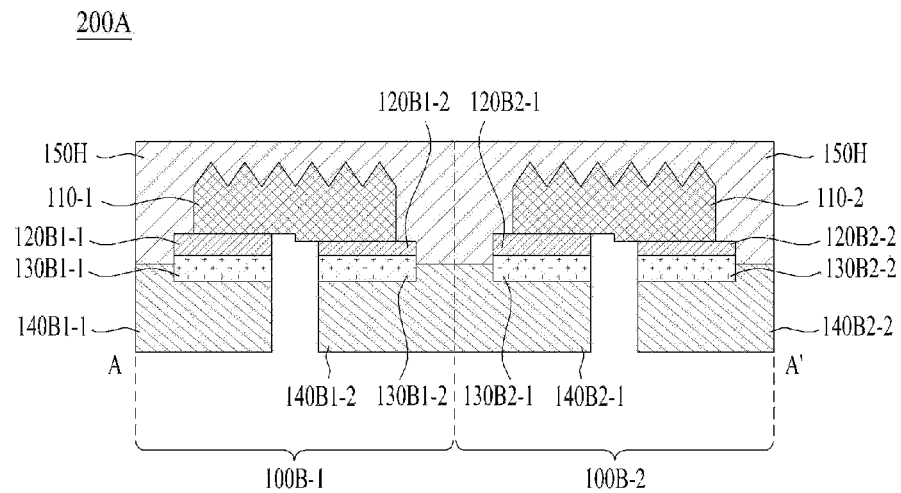
【FIG. 14a】
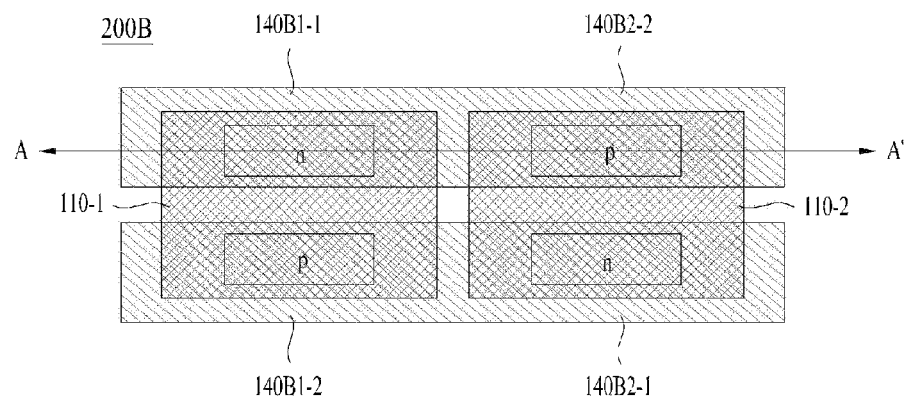

[FIG. 14b]
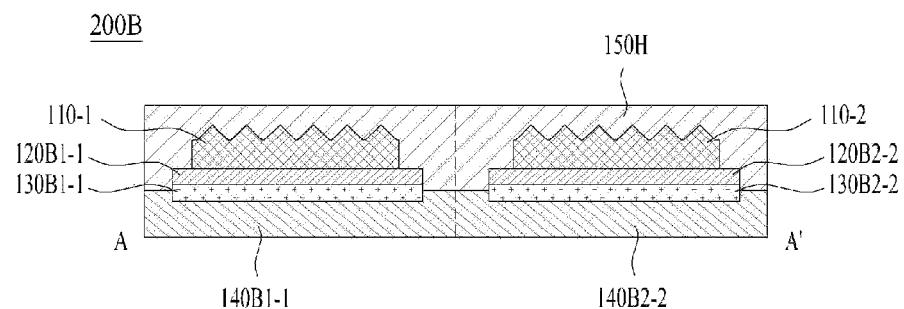
[FIG. 15a]
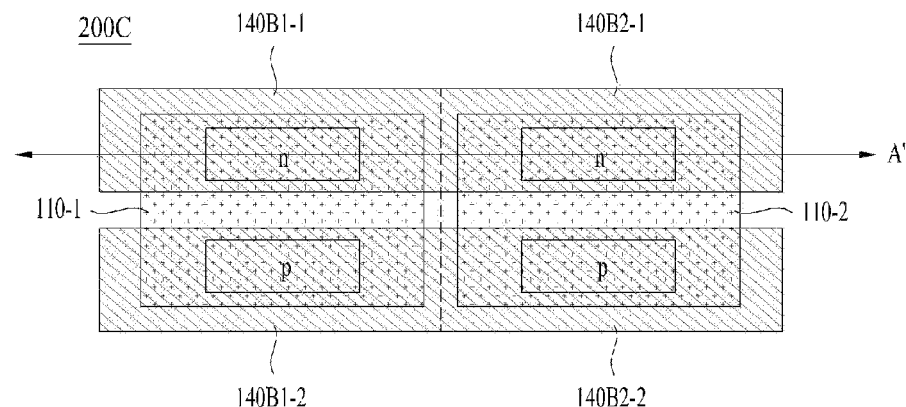
[FIG. 15b]
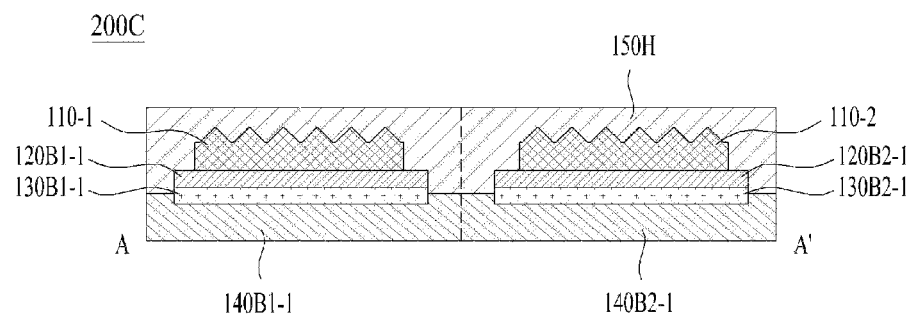

[FIG. 16]
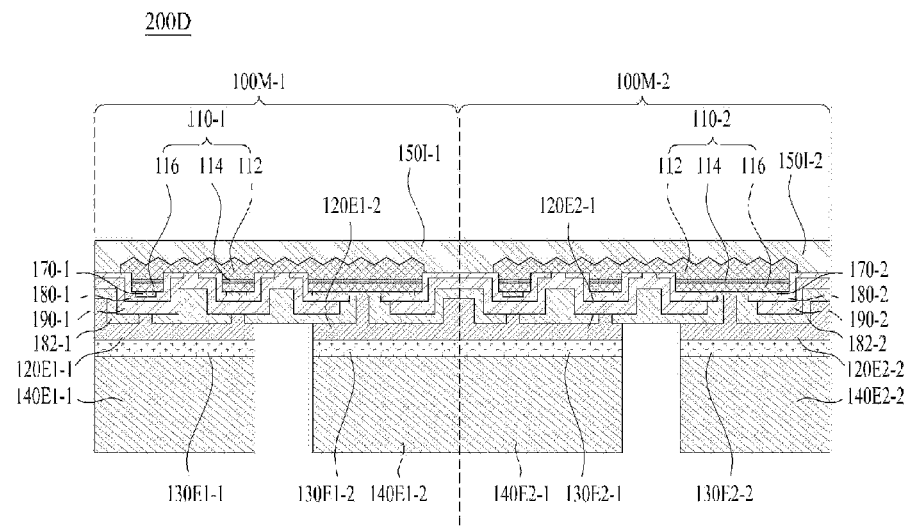
[FIG. 17a]
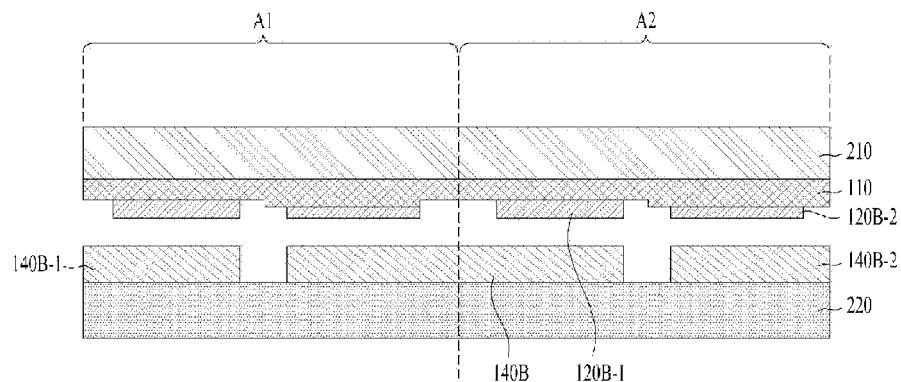
[FIG. 17b]
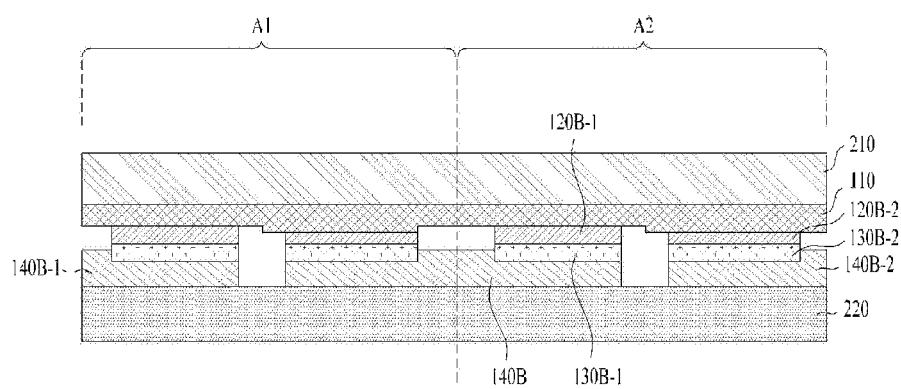

[FIG. 17c]
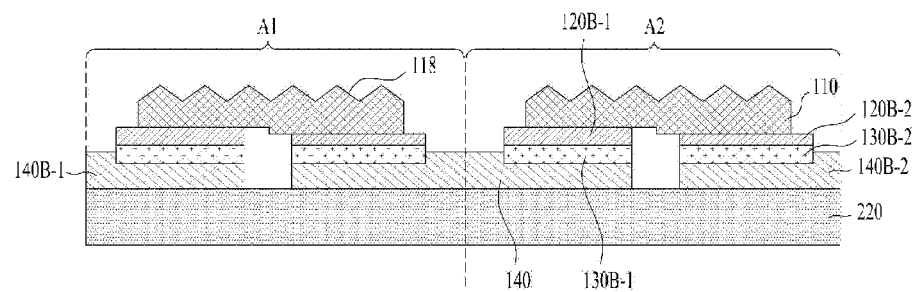
[FIG. 17d]
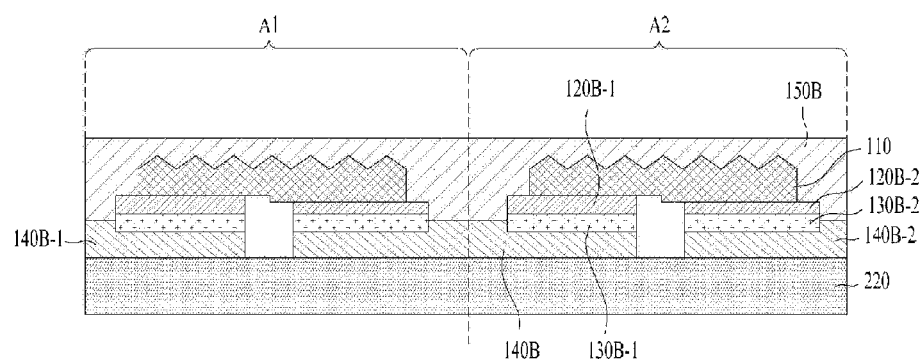
[FIG. 17e]
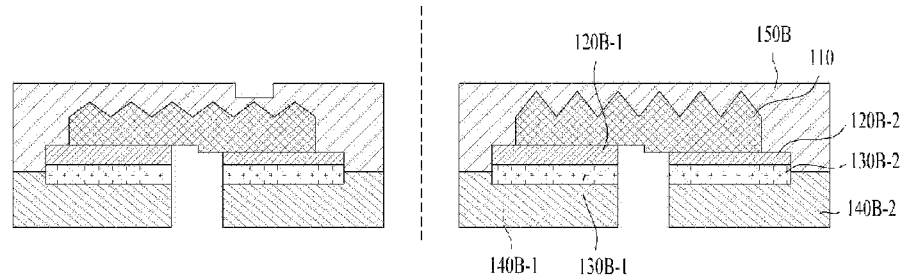

【FIG. 18a】
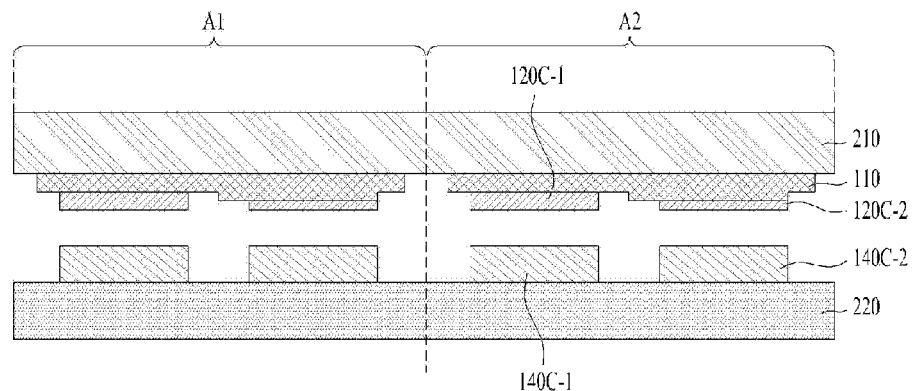
【FIG. 18b】
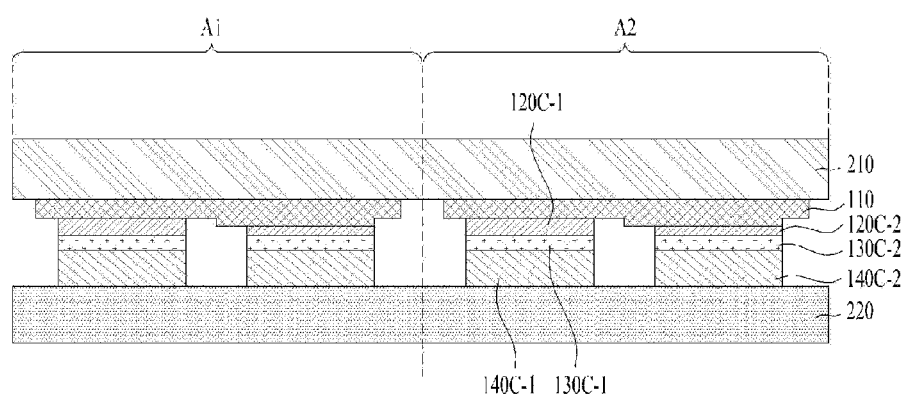
【FIG. 18c】
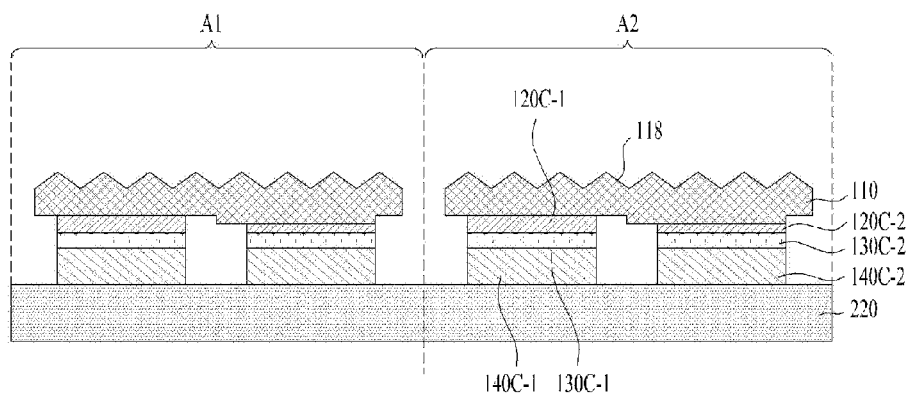

[FIG. 18d]
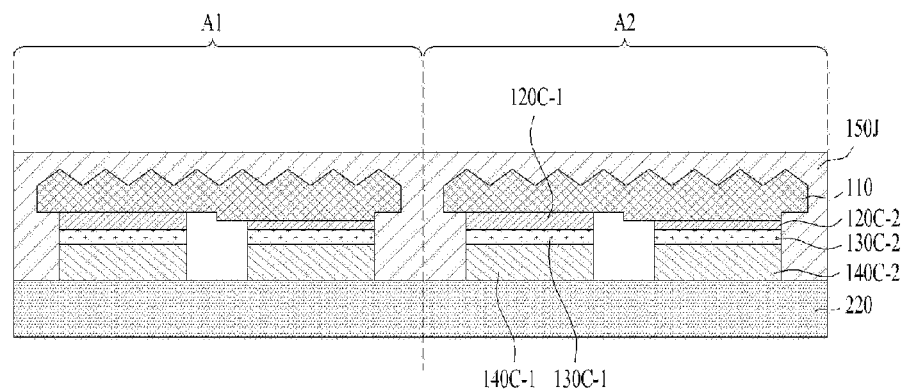
[FIG. 18e]
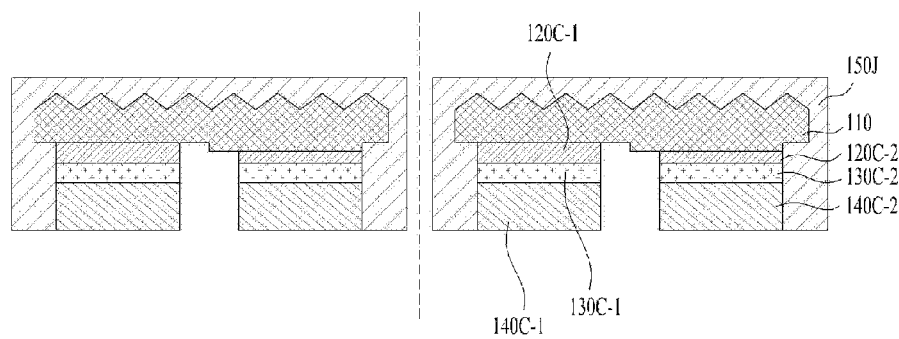
[FIG. 19a]
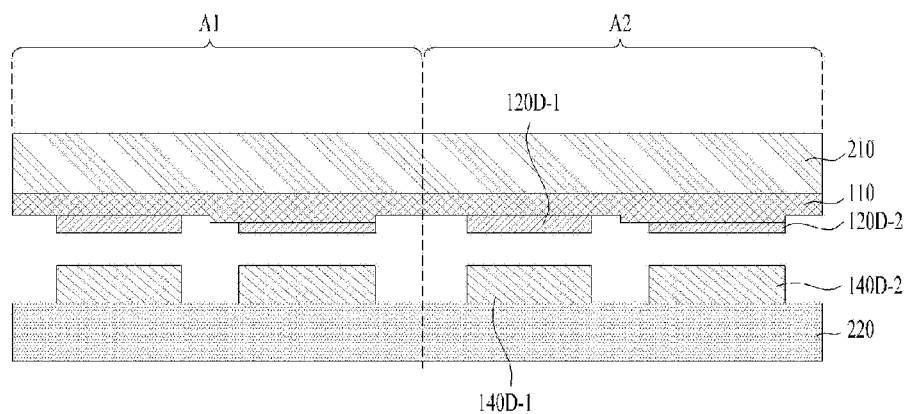

[FIG. 19b]
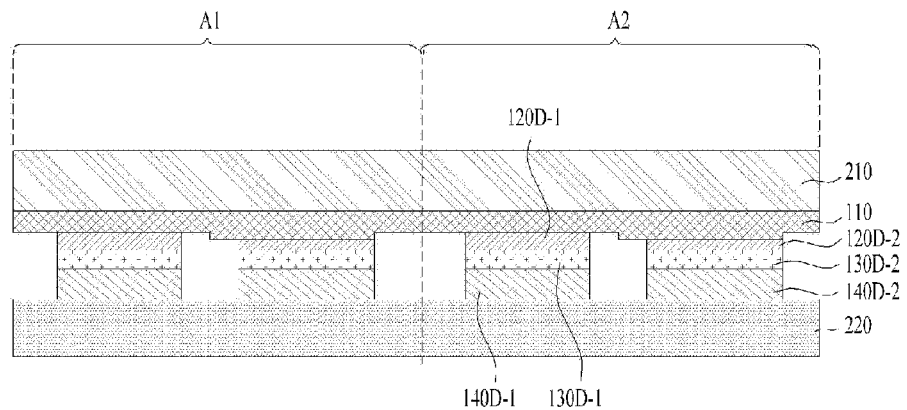
[FIG. 19c]
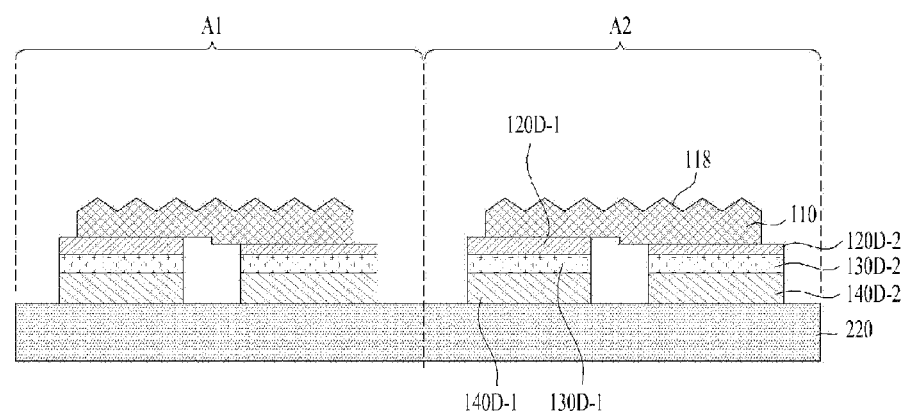
[FIG. 19d]
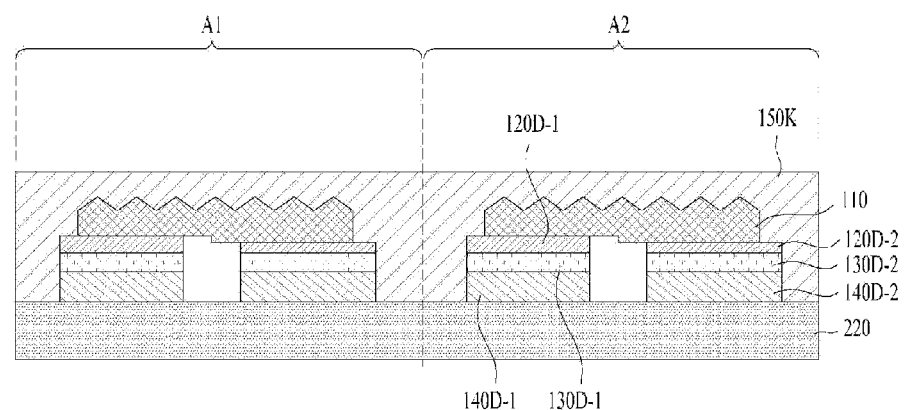

【FIG. 19e】
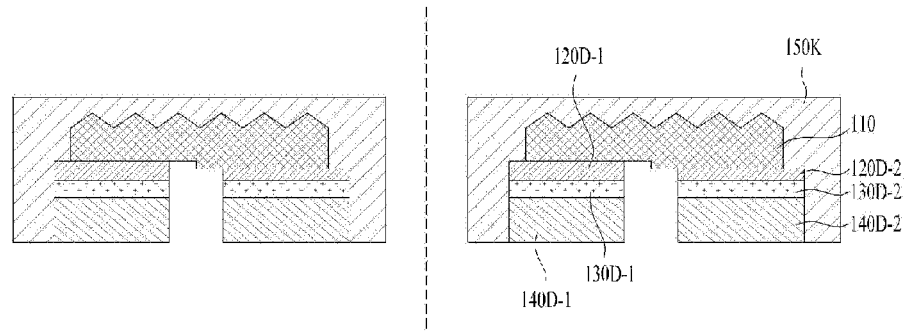
【FIG. 20a】
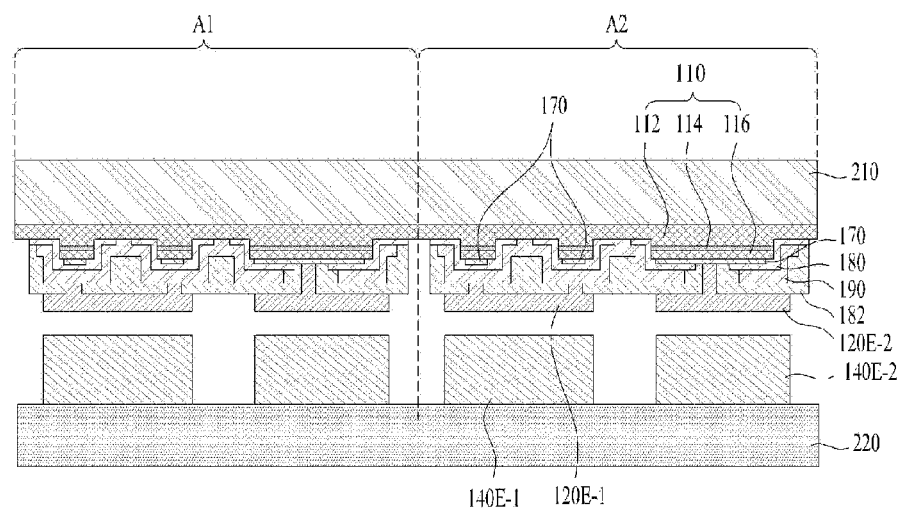
【FIG. 20b】
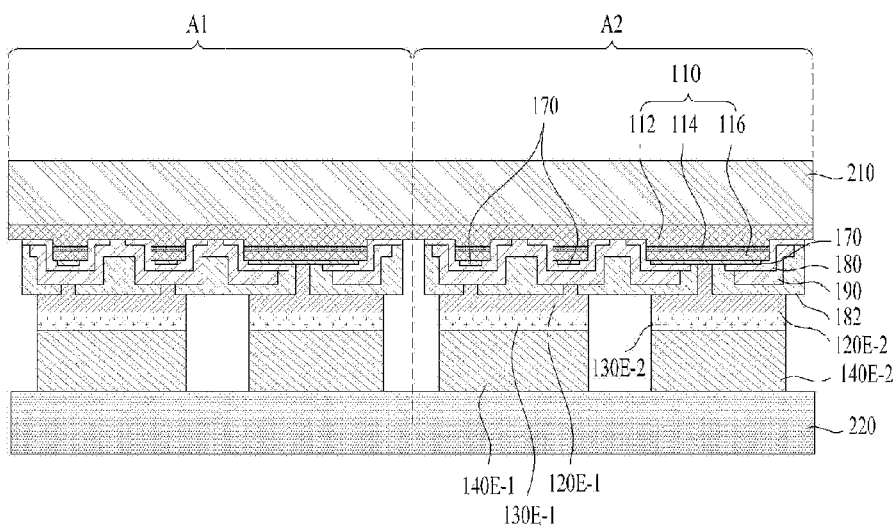

【FIG. 20c】
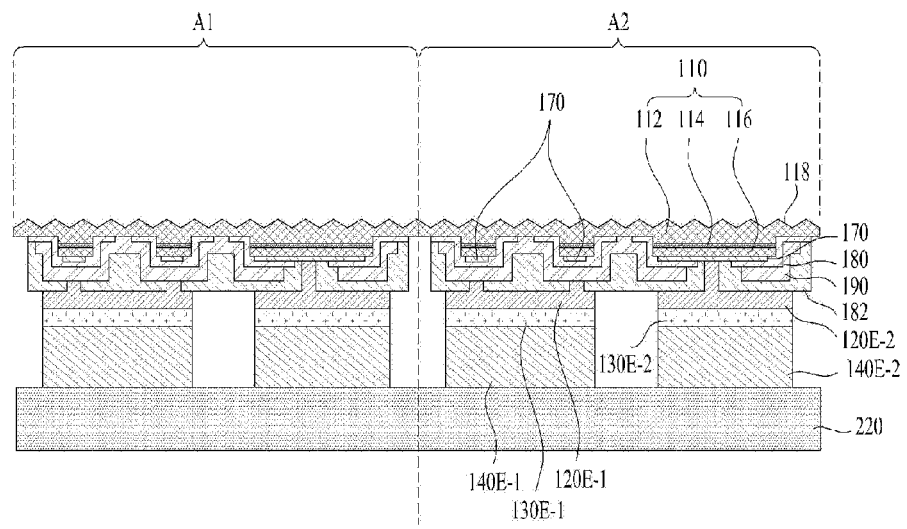
【FIG. 20d】
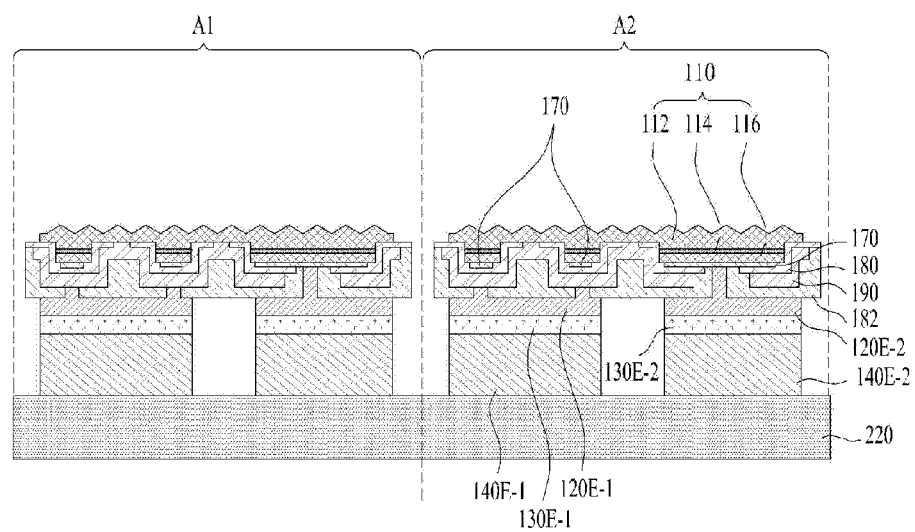

【FIG. 20e】
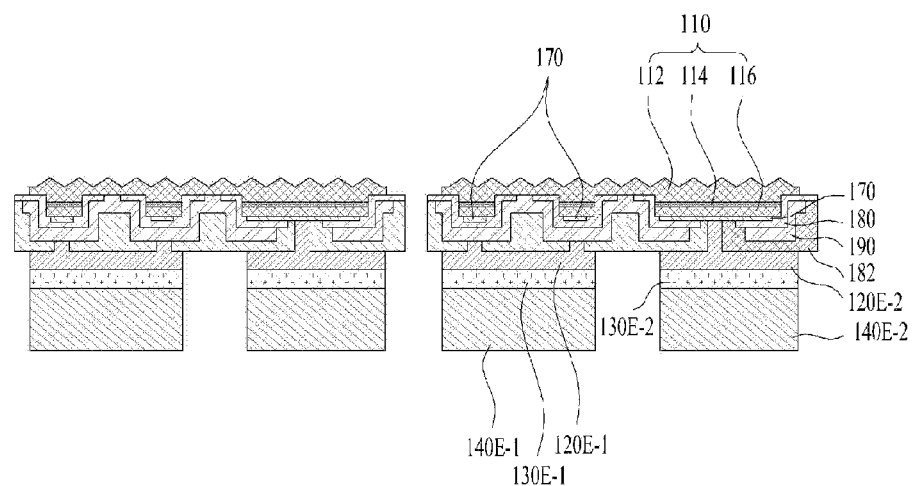
【FIG. 21a】
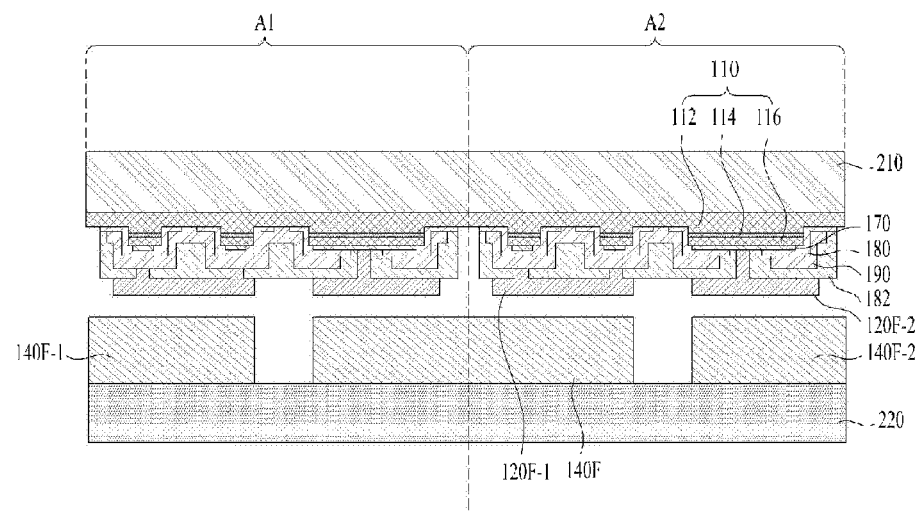

LIGHT-EMITTING DEVICE ARRAY AND LIGHT-EMITTING APPARATUS INCLUDING LIGHT-EMITTING DEVICE ARRAY

Cross Reference to Related Applications

This application is a U.S. National Stage Application under 35 U.S.C. § 371 of PCT Application No. PCT/KR2015/007393, filed Jul. 16, 2015, which claims priority to Korean Patent Application No. 10-2014-0111388, filed Aug. 26, 2014, whose entire disclosures are hereby incorporated by reference.

Field of Invention

Embodiments relate to a light-emitting device array and a light-emitting apparatus including the light-emitting device array.

Background Art

A light-emitting diode (LED) is a kind of semiconductor device that converts electricity into infrared rays or light using the properties of a compound semiconductor to transmit or receive a signal or that is used as a light source. Group III-V nitride semiconductors have attracted attention as a core material of a light-emitting device, such as a light-emitting diode (LED) or a laser diode (LD), thanks to the physical and chemical properties thereof.

The light-emitting diode exhibits excellent environmentally friendly characteristics, since the light-emitting diode does not include environmentally toxic materials, such as mercury (Hg), which is used in conventional lighting fixtures, such as an incandescent lamp and a fluorescent lamp. In addition, the light-emitting diode has advantages of a long lifespan and low power consumption. For these reasons, the light-emitting diode has replaced conventional light sources.

A conventional light-emitting device may include a substrate and an n-type GaN layer, an active layer, and a p-type GaN layer sequentially disposed on the substrate. That is, the conventional light-emitting device requires a substrate. For this reason, process costs are increased, and a production period is lengthened. In addition, the conventional light-emitting device is not suitable for high-powered applications, since the heat resistance of the substrate is high. Furthermore, the thickness of the conventional light-emitting device, which requires a substrate, may be increased. Moreover, freedom in designing a light-emitting device array or a light-emitting module including the light-emitting device may be reduced due to limitations on the size of the substrate, and expenses may be increased.

Summary of the Invention

Embodiments provide a light-emitting device array and a light-emitting apparatus including the light-emitting device array.

In one embodiment, a light-emitting device includes a light-emitting structure including a first conductive semiconductor layer, an active layer, and a second conductive semiconductor layer, a (1-1)th electrode connected to the first conductive semiconductor layer exposed by mesa-etching the first conductive semiconductor layer, the active layer, and the second conductive semiconductor layer, a (1-2)th electrode connected to the second conductive semiconductor layer, (2-1)th and (2-2)th electrodes connected to the (1-1)th and (1-2)th electrodes, respectively, a first bonding layer disposed between the (1-1)th electrode and the (2-1)th electrode, and a second bonding layer disposed between the (1-2)th electrode and the (2-2)th electrode.

The top surface of the light-emitting structure may contact air.

The light-emitting device may further include a molding layer disposed so as to surround at least one selected from among the light-emitting structure, the (1-1)th electrode, the (1-2)th electrode, the (2-1)th electrode, the (2-2)th electrode, the first bonding layer, and the second bonding layer.

The molding layer may include a fluorescent substance.

The molding layer may include a first molding member disposed at at least one selected from among the light-emitting structure, the (1-1)th and (1-2)th electrodes, the first and second bonding layers, and the (2-1)th and (2-2)th electrodes and a second molding member disposed at at least one selected from among the light-emitting structure, the (1-1)th and (1-2)th electrodes, the first and second bonding layers, the (2-1)th and (2-2)th electrodes, and the first molding member.

At least one of the first or second molding member may include a fluorescent substance, or may not include a fluorescent substance (or, phosphor).

The first bonding layer may bond the (1-1)th electrode and the (2-1)th electrode to each other by eutectic bonding, and the second bonding layer may bond the (1-2)th electrode and the (2-2)th electrode to each other by eutectic bonding. Alternatively, the first bonding layer may bond the (1-1)th electrode and the (2-1)th electrode to each other by weld bonding, and the second bonding layer may bond the (1-2)th electrode and the (2-2)th electrode to each other by weld bonding.

The sum of thicknesses of the (1-1)th electrode, the (2-1)th electrode, and the first bonding layer may be greater than the thickness of the light-emitting structure. The sum of thicknesses of the (1-1)th electrode, the (2-1)th electrode, and the first bonding layer may range from 10 μm to 500 μm.

The top surface of the light-emitting structure may have a roughness portion.

A first width of the light-emitting structure may be greater than a second width, represented by the equation below.

$$W2 = W21 + W22 + D$$

Where W2 indicates the second width, W21 indicates the width of the (2-1)th electrode, W22 indicates the width of the (2-2)th electrode, and D indicates the horizontal distance between the (2-1)th electrode and the (2-2)th electrode.

Alternatively, the first width of the light-emitting structure may be equal to or less than the second width.

The width of the (2-1)th electrode may be equal to or greater than that of the (1-1)th electrode, and the width of the (2-2)th electrode may be equal to or greater than that of the (1-2)th electrode.

The (2-1)th electrode may be disposed so as to surround at least one of the bottom surface or the side surface of the first bonding layer, and the (2-2)th electrode may be disposed so as to surround at least one of the bottom surface or the side surface of the second bonding layer.

The (1-1)th electrode and the first bonding layer may have the same width, and the (1-2)th electrode and the second bonding layer may have the same width.

The light-emitting device may further include a first passivation layer disposed at at least one selected from among the light-emitting structure, the (1-1)th and (1-2)th electrodes, the first and second bonding layers, and the (2-1)th and (2-2)th electrodes.

The light-emitting device may further include a second conductive electrode connected to the second conductive semiconductor layer, a second passivation layer disposed so as to cover the second conductive electrode and the bottom surface of the first conductive semiconductor layer exposed by the mesa etching, a first conductive electrode disposed under the second passivation layer and connected to the first conductive semiconductor layer by passing through the second passivation layer, and a third passivation layer disposed under the first conductive electrode, wherein the (1-1)th electrode and the (1-2)th electrode may be connected respectively to the first conductive electrode and the second conductive electrode by passing through the third passivation layer.

The width of the (2-1)th electrode may be equal to or greater than that of the (1-1)th electrode, and the width of the (2-2)th electrode may be equal to or greater than that of the (1-2)th electrode. The (2-1)th electrode may be disposed so as to surround at least one of the bottom surface or the side surface of the first bonding layer, and the (2-2)th electrode may be disposed so as to surround at least one of the bottom surface or the side surface of the second bonding layer. The (1-1)th electrode and the first bonding layer may have the same width, and the (1-2)th electrode and the second bonding layer may have the same width.

In another embodiment, a light-emitting device array includes a plurality of light-emitting devices connected to each other, each of the light-emitting devices including the light-emitting device according to the above embodiment.

First and second light-emitting devices selected from among the light-emitting devices may be adjacent to each other, and the (2-2)th electrode of the first light-emitting device and the (2-1)th electrode of the second light-emitting device may be integrated.

First and second light-emitting devices selected from among the light-emitting devices may be adjacent to each other, the (2-1)th electrode of the first light-emitting device and the (2-2)th electrode of the second light-emitting device may be integrated, and the (2-2)th electrode of the first light-emitting device and the (2-1)th electrode of the second light-emitting device may be integrated.

First and second light-emitting devices selected from among the light-emitting devices may be integrated, the (2-1)th electrode of the first light-emitting device and the (2-1)th electrode of the second light-emitting device may be integrated, and the (2-2)th electrode of the first light-emitting device and the (2-2)th electrode of the second light-emitting device may be integrated.

In another embodiment, a light-emitting device package includes the light-emitting device array.

In a further embodiment, a light-emitting apparatus includes the light-emitting device package.

Advantageous Effects

In a light-emitting device array and a light-emitting apparatus including the light-emitting device array according to embodiments, no substrate is required. Consequently, process costs are reduced, and a production period is shortened. In addition, the embodiments are suitable for high-powered applications, the thicknesses of the embodiments are reduced, freedom in designing the embodiments is increased, and a process of manufacturing the embodiments is simplified, whereby expenses are reduced. Furthermore, it is possible to prevent static electricity from being introduced through a substrate. Also, the degree of integration of the light-emitting device array may have improved.

Brief Description of the Drawings

FIGS. 1 to 12 are sectional views showing light-emitting devices according to embodiments;

FIGS. 13 to 16 are plan views and sectional views showing light-emitting device arrays according to embodiments;

FIG. 17 shows process sectional views illustrating a method of manufacturing the light-emitting device shown in FIG. 2;

FIG. 18 shows process sectional views illustrating a method of manufacturing the light-emitting device shown in FIG. 3;

FIG. 19 shows process sectional views illustrating a method of manufacturing the light-emitting device shown in FIG. 4;

FIG. 20 shows process sectional views illustrating a method of manufacturing the light-emitting device shown in FIG. 8 or 9;

Detailed Description

Figure 21B:
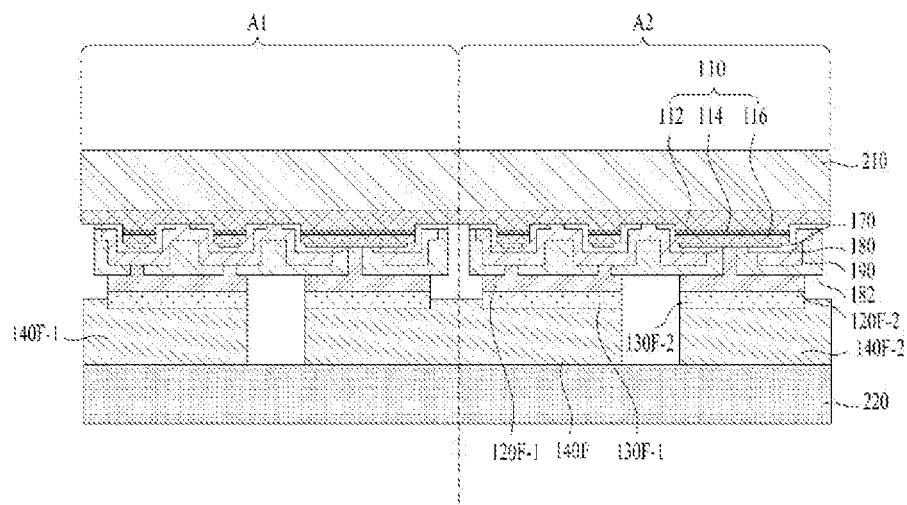
FIG. 21 shows process sectional views illustrating a method of manufacturing the light-emitting devices shown in FIGS. 10 to 12.

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the disclosure to those skilled in the art.

In the following description of the embodiments, it will be understood that, when each element is referred to as being "on" or "under" another element, it can be "directly" on or under another element or can be "indirectly" formed such that an intervening element is also present. In addition, terms such as "on" or "under" should be understood on the basis of the drawings.

In addition, relational terms, such as "first," "second," "above," and "below," are used only to distinguish between one subject or element and another subject or element without necessarily requiring or involving any physical or logical relationship or sequence between such subjects or elements.

In the drawings, the thickness or size of each layer may be exaggerated, omitted, or schematically illustrated for convenience of description and clarity. In addition, the size or area of each constituent element does not entirely reflect the actual size thereof.

In the following description, a light-emitting device according to each embodiment includes an LED using a plurality of compound semiconductor layers, e.g. group III-V compound semiconductor layers. The LED may be a color LED that emits a blue color, a green color, or a red color, an ultraviolet (UV) LED, a deep UV LED, or a non-polar LED. Light emitted from the LED may be realized using various semiconductors. However, the disclosure is not limited thereto.

FIG. 1 is a sectional view showing a light-emitting device 100A according to an embodiment.

The light-emitting device 100A shown in FIG. 1 includes a light-emitting structure 110, (1-1)th and (1-2)th electrodes 120A-1 and 120A-2, first and second bonding layers 130A-1 and 130A-2, (2-1)th and (2-2)th electrodes 140A-1 and 140A-2, and a molding layer 150A.

The light-emitting structure 110 includes a first conductive semiconductor layer 112, an active layer 114, and a second conductive semiconductor layer 116.

The active layer 114 is disposed under the first conductive semiconductor layer 112. The first conductive semiconductor layer 112 may be formed of a semiconductor compound, may be embodied by a group III-V or II-VI compound semiconductor, and may be doped with a first conductive dopant. For example, the first conductive semiconductor layer 112 may be formed of a semiconductor material having a formula of $Al_xIn_yGa_{(1-x-y)}N$ ($0 \leq x \leq 1$, $0 \leq y \leq 1$, $0 \leq x+y \leq 1$) or one or more selected from among InAlGaN, AlGaAs, GaP, GaAs, GaAsP, and AlGaInP. In the case in which the first conductive semiconductor layer 112 is an n-type semiconductor layer, the first conductive dopant may include Si, Ge, Sn, Se, or Te as an n-type dopant. The first conductive semiconductor layer 112 may have a single- or multi-layer structure. However, the disclosure is not limited thereto. In the case in which the light-emitting device 100A shown in FIG. 1 is a UV, deep UV, or non-polar light-emitting device, the first conductive semiconductor layer 112 may include at least one of InAlGaN or AlGaN. In the case in which the first conductive semiconductor layer 112 is formed of AlGaN, the content of Al may be 50%. In the case in which the first conductive semiconductor layer 112 is an n-type semiconductor layer, the first conductive semiconductor layer 112 may be formed of $Al_{0.5}GaN$, and may have a thickness of 0.6 μm to 2.6 μm, for example 1.6 μm.

The active layer 114, which is disposed between the first and second conductive semiconductor layers 112 and 114, may include any one selected from among a single-well structure, a multi-well structure, a single-quantum-well structure, a multi-quantum-well (MQW) structure, a quantum-dot structure, and a quantum-wire structure. A well layer and a barrier layer of the active layer 114 may be formed so as to have one or more pair structures selected from among, for example, InGaN/GaN, InGaN/InGaN, GaN/AlGaN, InAlGaN/GaN, GaAs(InGaAs)/AlGaAs, and GaP(InGaP)/AlGaP, which are group III-V compound semiconductor materials. However, the disclosure is not limited thereto. The well layer may be formed of a material having a narrower energy band gap than the barrier layer. In particular, the active layer 114 of the embodiment may generate UV or deep UV light.

For example, the active layer 114 may include an MQW structure, and the well layer and the barrier layer may have a structure including five pairs. In each pair, the well layer may have a thickness of 0.5 nm to 2.5 nm, for example 1.5 nm, and the barrier layer may have a thickness of 7 nm to 17 nm, for example 12 nm.

The second conductive semiconductor layer 116 is disposed under the active layer 114. The second conductive semiconductor layer 116 may be formed of a semiconductor compound, may be embodied by a group III-V or II-VI compound semiconductor, and may be doped with a second conductive dopant. For example, the second conductive semiconductor layer 116 may be formed of a semiconductor material having a formula of $In_xAl_yGa_{1-x-y}N$ ($0 \leq x \leq 1$, $0 \leq y \leq 1$, $0 \leq x+y \leq 1$) or one or more selected from among AlInN, AlGaAs, GaP, GaAs, GaAsP, and AlGaInP. In the case in which the second conductive semiconductor layer 116 is a p-type semiconductor layer, the second conductive dopant may include Mg, Zn, Ca, Sr, or Ba as a p-type dopant. The second conductive semiconductor layer 116 may have a single- or multi-layer structure. However, the disclosure is not limited thereto. In the case in which the light-emitting device 100A shown in FIG. 1 is a UV, deep UV, or non-polar light-emitting device, the second conductive semiconductor layer 116 may include at least one of InAlGaN or AlGaN. In the case in which the second conductive semiconductor layer 116 is a p-type semiconductor layer, the second conductive semiconductor layer 116 may include graded AlGaN with the concentration of Al having a grade, and may have a thickness of 10 nm to 100 nm, in order to reduce a lattice difference.

According to this embodiment, the top surface of the light-emitting structure 110 may have a roughness portion 118. That is, the top surface of the first conductive semiconductor layer 112 may have a roughness portion 118. However, the disclosure is not limited thereto.

The (1-1)th electrode 120A-1 is disposed under the first conductive semiconductor layer 112 exposed by mesa etching of the first conductive semiconductor layer 112, the active layer 114, and the second conductive semiconductor layer 116, and is electrically connected to the first conductive semiconductor layer 112. The (1-2)th electrode 120A-2 is disposed under the second conductive semiconductor layer 116, and is electrically connected to the second conductive semiconductor layer 116.

The (2-1)th electrode 140A-1 is disposed under the (1-1)th electrode 120A-1, and is electrically connected to the (1-1)th electrode 120A-1 via the first bonding layer 130A-1. The (2-2)th electrode 140A-2 is disposed under the (1-2)th electrode 120A-2, and is electrically connected to the (1-2)th electrode 120A-2 via the second bonding layer 130A-2. Since a substrate (not shown) is not disposed under the (2-1)th and (2-2)th electrodes 140A-1 and 140A-2, the bottom surface 142-1 of the (2-1)th electrode 140A-1 contacts air, and the bottom surface 142-2 of the (2-2)th electrode 140A-2 contacts air.

In addition, the thickness of the (2-1)th electrode 140A-1 may be greater than that of the (1-1)th electrode 120A-1, and the thickness of the (2-2)th electrode 140A-2 may be greater than that of the (1-2)th electrode 120A-2.

In addition, the sum t1 of the thicknesses of the (1-1)th electrode 120A-1, the (2-1)th electrode 140A-1, and the first bonding layer 130A-1 may be greater than the thickness t2 of the light-emitting structure 110. For example, the sum t1 of the thicknesses of the (1-1)th electrode 120A-1, the (2-1)th electrode 140A-1, and the first bonding layer 130A-1 may range from 10 μm to 500 μm. However, the disclosure is not limited thereto.

In addition, the sum t3 of the thicknesses of the (1-2)th electrode 120A-2, the (2-2)th electrode 140A-2, and the second bonding layer 130A-2 may be greater than the thickness t2 of the light-emitting structure 110. For example, the sum t3 of the thicknesses of the (1-2)th electrode 120A-2, the (2-2)th electrode 140A-2, and the second bonding layer 130A-2 may range from 10 μm to 500 μm. However, the disclosure is not limited thereto. If the thickness t1 or t3 is smaller than 10 μm, it may be difficult to support the light-emitting structure 110 which does not have any substrate. Also, if the thickness t1 or t3 is greater than 500 μm, the manufacturing cost may increase, the thickness of the light-emitting device may increase, and thermal resistance may increase, thereby lowering capability for thermal dissipation.

Each of the (1-1)th, (1-2)th, (2-1)th, and (2-2)th electrodes 120A-1, 120A-2, 140A-1, and 140A-2 may be formed of a metal material.

The first bonding layer 130A-1 is disposed between the (1-1)th electrode 120A-1 and the (2-1)th electrode 140A-1, and the second bonding layer 130A-2 is disposed between the (1-2)th electrode 120A-2 and the (2-2)th electrode 140A-2.

In addition, the first bonding layer 130A-1 may bond the (1-1)th electrode 120A-1 and the (2-1)th electrode 140A-1 to each other by eutectic bonding, weld bonding, or diffusion bonding, and the second bonding layer 130A-2 may bond the (1-2)th electrode 120A-2 and the (2-2)th electrode 140A-2 to each other by eutectic bonding, weld bonding, or diffusion bonding.

Each of the first and second bonding layers 130A-1 and 130A-2 may be formed of a solid-state material exhibiting electrical conductivity.

As shown in FIG. 1, the light-emitting device 100A includes the molding layer 150A. However, the disclosure is not limited thereto. That is, in another embodiment, the light-emitting device 100A may not include the molding layer 150A. In this case, the top surface of the light-emitting structure 110, i.e. the top surface of the first conductive semiconductor layer 112 may contact air. The reason for this is because the molding layer 150A or an upper substrate is not provided on the light-emitting structure 110.

However, in the case in which the light-emitting device 100A includes the molding layer 150A, as shown in FIG. 1, the top surface of the molding layer 150A, rather than the light-emitting structure 110, may contact air. The reason for this is because an upper substrate is not provided on the molding layer 150A.

The molding layer 150A may surround at least one selected from among the light-emitting structure 110, the (1-1)th electrode 120A-1, the (1-2)th electrode 120A-2, the (2-1)th electrode 140A-1, the (2-2)th electrode 140A-2, the first bonding layer 130A-1, and the second bonding layer 130A-2.

In addition, the molding layer 150A may include first and second molding members 152 and 154. As shown in FIG. 1, the first and second molding members 152 and 154 may be separate members. In another embodiment, the first and second molding members 152 and 154 may be integrated, unlike FIG. 1. The molding layer 150A including the integrated first and second molding members 152 and 154 may include a fluorescent substance (or, phosphor) to change the wavelength of the light emitted from the light-emitting structure 110. The molding layer 150A may not include a fluorescent substance.

The first molding member 152 may be disposed at at least one selected from among the light-emitting structure 110, the (1-1)th and (1-2)th electrodes 120A-1 and 120A-2, the first and second bonding layers 130A-1 and 130A-2, and the (2-1)th and (2-2)th electrodes 140A-1 and 140A-2. For example, as shown in FIG. 1, the first molding member 152 may be disposed on the first conductive semiconductor layer 112.

The second molding member 154 may be disposed at at least one selected from among the light-emitting structure 110, the (1-1)th and (1-2)th electrodes 120A-1 and 120A-2, the first and second bonding layers 130A-1 and 130A-2, the (2-1)th and (2-2)th electrodes 140A-1 and 140A-2, and the first molding member 152.

In addition, at least one of the first or second molding member 152 or 154 may include a fluorescent substance, or may not include a fluorescent substance.

FIG. 2 is a sectional view showing a light-emitting device 100B according to another embodiment.

The first width W1 of a light-emitting structure 110 may be equal to or less than the second width W2, represented by Equation 1 below.

$$W2=W21+W22+D \qquad \text{Equation 1}$$

Where, referring to FIGS. 1 and 2, the (2-1)th width W21 indicates the width of a (2-1)th electrode 140A-1 or 140B-1, the (2-2)th width W22 indicates the width of a (2-2)th electrode 140A-2 or 140B-2, and D indicates the horizontal distance between the (2-1)th electrode 140A-1 or 140B-1 and the (2-2)th electrode 140A-2 or 140B-2.

In the light-emitting device 100A shown in FIG. 1, the first width W1 is equal to the second width W2. In the light-emitting device 100B shown in FIG. 2, the first width W1 is less than the second width W2.

In addition, in the light-emitting device 100A shown in FIG. 1, the (2-1)th width W21 is equal to the (3-1)th width W31 of the (1-1)th electrode 120A-1, and the (2-2)th width W22 is equal to the (3-2)th width W32 of the (1-2)th electrode 120A-2. On the other hand, in the light-emitting device 100B shown in FIG. 2, the (2-1)th width W21 may be greater than the (3-1)th width W31, and the (2-2)th width W22 may be greater than the (3-2)th width W32. In this case, the (2-1)th electrode 140B-1 may be disposed so as to surround at least one of the bottom surface or the side surface of a first bonding layer 130B-1, and the (2-2)th electrode 140B-2 may be disposed so as to surround at least one of the bottom surface or the side surface of a second bonding layer 130B-2.

In addition, in FIGS. 1 and 2, the (1-1)th electrodes 120A-1 and 120B-1 and the first bonding layers 130A-1 and 130B-1 are shown as having the same width, and the (1-2)th electrodes 120A-2 and 120B-2 and the second bonding layers 130A-2 and 130B-2 are shown as having the same width. However, the disclosure is not limited thereto.

In FIG. 1, the molding layer 150A includes the first and second molding members 152 and 154. In contrast, a molding layer 150B shown in FIG. 2 may be configured to have a single layer. The molding layer 150B may include a fluorescent substance.

The light-emitting device 100B shown in FIG. 2 is identical to the light-emitting device 100A shown in FIG. 1 except that the first width W1 and the second width W2 are different from each other, the (2-1)th width W21 and the (3-1)th width W31 are different from each other, the (2-2)th width W22 and the (3-2)th width W32 are different from each other, and the molding layer 150B has a single layer, as previously described, and therefore a duplicate description will be omitted. That is, the (1-1)th, (1-2)th, (2-1)th, and (2-2)th electrodes 120B-1, 120B-2, 140B-1, and 140B-2 shown in FIG. 2 correspond respectively to the (1-1)th, (1-2)th, (2-1)th, and (2-2)th electrodes 120A-1, 120A-2, 140A-1, and 140A-2 shown in FIG. 1.

FIG. 3 is a sectional view showing a light-emitting device 100C according to still another embodiment.

In the light-emitting device 100A shown in FIG. 1, the first width W1 is equal to the second width W2. On the other hand, in the light-emitting device 100C shown in FIG. 3, the first width W1 is greater than the second width W2.

In addition, the light-emitting device 100A shown in FIG. 1 includes the molding layer 150A. In contrast, the light-emitting device 100C shown in FIG. 3 includes no molding layer. In still another embodiment, the light-emitting device 100C shown in FIG. 3 may include a molding layer 150A or 150B having the structure shown in FIG. 1 or 2.

The light-emitting device 100C shown in FIG. 3 is identical to the light-emitting device 100A shown in FIG. 1 except for the differences described above, and therefore a duplicate description will be omitted.

FIG. 4 is a sectional view showing a light-emitting device 100D according to still another embodiment.

In the light-emitting device 100B shown in FIG. 2, the (2-1)th width W21 is greater than the (3-1)th width W31, and the (2-2)th width W22 is greater than the (3-2)th width W32. In contrast, in the light-emitting device 100D shown in FIG. 4, the (2-1)th width W21 is equal to the (3-1)th width W31, and the (2-2)th width W22 is equal to the (3-2)th width W32. In addition, unlike the light-emitting device 100B shown in FIG. 2, the light-emitting device 100D shown in FIG. 4 does not include the molding layer 150B. The light-emitting device 100D shown in FIG. 4 is identical to the light-emitting device 100B shown in FIG. 2 except for the differences described above, and therefore a duplicate description will be omitted. Consequently, the description of components of the light-emitting device 100B shown in FIG. 2 that are identical to those of the light-emitting device 100D shown in FIG. 4 may be applied to the light-emitting device 100D.

FIG. 5 is a sectional view showing a light-emitting device 100E according to still another embodiment.

The light-emitting device 100E shown in FIG. 5 may further include a first passivation layer 160A. With this exception, the light-emitting device 100E shown in FIG. 5 is identical to the light-emitting device 100D shown in FIG. 4, and therefore a duplicate description will be omitted. Consequently, the description of components of the light-emitting device 100D shown in FIG. 4 that are identical to those of the light-emitting device 100E shown in FIG. 5 may be applied to the light-emitting device 100E.

The first passivation layer 160A may be disposed at at least one selected from among a light-emitting structure 110, (1-1)th and (1-2)th electrodes 120D-1 and 120D-2, first and second bonding layers 130D-1 and 130D-2, and (2-1)th and (2-2)th electrodes 140D-1 and 140D-2. In the light-emitting device 100E shown in FIG. 5, the first passivation layer 160A is disposed at the top surface and the side surface of the light-emitting structure 110, a portion of the top surface and the side surface of the (1-1)th and (1-2)th electrodes 120D-1 and 120D-2, the side surface of the first and second bonding layers 130D-1 and 130D-2, and the side surface of the (2-1)th and (2-2)th electrodes 140D-1 and 140D-2.

FIG. 6 is a sectional view showing a light-emitting device 100F according to still another embodiment.

In the light-emitting device 100F shown in FIG. 6, a first passivation layer 160B is disposed only at the top surface and the side surface of a light-emitting structure 110 and the top surface of (1-1)th and (1-2)th electrodes 120D-1 and 120D-2, unlike the light-emitting device 100E shown in FIG. 5. The light-emitting device 100F shown in FIG. 6 is identical to the light-emitting device 100E shown in FIG. 5 except for the differences described above, and therefore a duplicate description will be omitted. Consequently, the description of components of the light-emitting device 100E shown in FIG. 5 that are identical to those of the light-emitting device 100F shown in FIG. 6 may be applied to the light-emitting device 100F.

FIG. 7 is a sectional view showing a light-emitting device 100G according to still another embodiment.

The light-emitting device 100G shown in FIG. 7 includes a light-emitting structure 110, (1-1)th and (1-2)th electrodes 120E-1 and 120E-2, first and second bonding layers 130E-1 and 130E-2, (2-1)th and (2-2)th electrodes 140E-1 and 140E-2, a second conductive electrode 170, second and third passivation layers 180 and 182, and a first conductive electrode 190.

The light-emitting structure 110, the (1-1)th and (1-2)th electrodes 120E-1 and 120E-2, the first and second bonding layers 130E-1 and 130E-2, and the (2-1)th and (2-2)th electrodes 140E-1 and 140E-2 shown in FIG. 7 perform the same functions as the light-emitting structure 110, the (1-1)th and (1-2)th electrodes 120A-1 and 120A-2, the first and second bonding layers 130A-1 and 130A-2, and the (2-1)th and (2-2)th electrodes 140A-1 and 140A-2 shown in FIG. 1, respectively.

The second conductive electrode 170 is disposed under a second conductive semiconductor layer 116 and is electrically connected to the second conductive semiconductor layer 116. The second conductive electrode 170 may be formed of metal. For example, the second conductive electrode 170 may be formed of Ag, Ni, Al, Rh, Pd, Ir, Ru, Mg, Zn, Pt, Au, Hf, or a selective combination thereof.

Alternatively, the second conductive electrode 170 may be a transparent conductive oxide (TCO). For example, the second conductive electrode 170 may include at least one selected from among the above-mentioned metal materials, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO. However, the disclosure is not limited thereto. The second conductive electrode 170 may include a material that ohmically contacts the second conductive semiconductor layer 116.

In addition, the second conductive electrode 170 may be formed of a reflective electrode material exhibiting ohmic properties, and may have a single- or multi-layer structure. In the case in which the second conductive electrode 170 performs an ohmic function, an additional ohmic layer (not shown) may not be formed.

The second passivation layer 180 is disposed so as to cover the second conductive electrode 170 and side and bottom parts of the light-emitting structure 110 including the bottom surface of the first conductive semiconductor layer 116 exposed by mesa etching.

The first conductive electrode 190 is disposed under the second passivation layer 180, and is electrically connected to a first conductive semiconductor layer 112 by passing through the second passivation layer 180. The first conductive electrode 190 may be formed of metal. For example, the first conductive electrode 190 may be formed of Ag, Ni, Al, Rh, Pd, Ir, Ru, Mg, Zn, Pt, Au, Hf, or a selective combination thereof.

The first conductive electrode 190 may be a transparent conductive oxide (TCO). For example, the first conductive electrode 190 may include at least one selected from among the above-mentioned metal materials, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO. However, the disclosure is not limited thereto. The first conductive electrode 190 may include a material that ohmically contacts the first conductive semiconductor layer 112.

In addition, the first conductive electrode 190 may be formed of a reflective electrode material exhibiting ohmic properties, and may have a single- or multi-layer structure.

In the case in which the first conductive electrode 190 performs an ohmic function, an additional ohmic layer (not shown) may not be formed.

The third passivation layer 182 is disposed under the first conductive electrode 190.

The first passivation layers 160A and 160B shown in FIGS. 5 and 6 and the second passivation layer 180 and the third passivation layer 182 shown in FIG. 7 may each include a transparent material, may each include an oxide, and may each include at least one selected from among $SiO_2$, $TiO_2$, SnO, ZnO, $Si_xO_y$, $Si_xN_y$ (for example, x=3 and y=4 or x=y=1), SiOxNy, ITO, and AZO.

The (1-1)th electrode 120E-1 is electrically connected to the first conductive electrode 190 by passing through the third passivation layer 182. The (1-2)th electrode 120E-2 is electrically connected to the second conductive electrode 170 by passing through the second passivation layer 180 and the third passivation layer 182.

In addition, the width of the (2-1)th electrode 140E-1 may be equal to that of the (1-1)th electrode 120E-1, and the width of the (2-2)th electrode 140E-2 may be equal to that of the (1-2)th electrode 120E-2. However, the disclosure is not limited thereto.

FIG. 8 is a sectional view showing a light-emitting device 100H according to still another embodiment.

The light-emitting device 100G shown in FIG. 7 includes no molding layer. On the other hand, the light-emitting device 100H shown in FIG. 8 includes a molding layer 150C. With this exception, the light-emitting device 100H shown in FIG. 8 is identical to the light-emitting device 100G shown in FIG. 7, and therefore a duplicate description will be omitted.

The molding layer 150C shown in FIG. 8 may be disposed at at least one selected from among a light-emitting structure 110, the top surfaces or the side surfaces of second and third passivation layers 180 and 182, and (1-1)th, (1-2)th, (2-1)th, and (2-2)th electrodes 120E-1, 120E-2, 140E-1, and 140E-2.

FIG. 9 is a sectional view showing a light-emitting device 100I according to still another embodiment.

In the light-emitting device 100I shown in FIG. 9, a molding layer 150D is disposed only at the top surface and the side surface of a light-emitting structure 110 and the top surface of a second passivation layer 180, unlike the light-emitting device 100H shown in FIG. 8. The light-emitting device 100I shown in FIG. 9 is identical to the light-emitting device 100H shown in FIG. 8 except for the differences described above, and therefore a duplicate description will be omitted.

FIG. 10 is a sectional view showing a light-emitting device 100J according to still another embodiment.

In the light-emitting device 100J shown in FIG. 10, the (2-1)th width W21 of a (2-1)th electrode 140F-1 may be greater than the (3-1)th width W31 of a (1-1)th electrode 120F-1, and the (2-2)th width W22 of a (2-2)th electrode 140F-2 may be greater than the (3-2)th width W32 of a (1-2)th electrode 120F-2, unlike the light-emitting device 100G shown in FIG. 7. In this case, the (2-1)th electrode 140F-1 may be disposed so as to surround at least one of the bottom surface or the side surface of a first bonding layer 130F-1, and the (2-2)th electrode 140F-2 may be disposed so as to surround at least one of the bottom surface or the side surface of a second bonding layer 130F-2.

In addition, the light-emitting device 100J shown in FIG. 10 further includes a molding layer 150E, unlike the light-emitting device 100G shown in FIG. 7.

The light-emitting device 100J shown in FIG. 10 is identical to the light-emitting device 100G shown in FIG. 7 except for the differences described above, and therefore a duplicate description will be omitted.

The molding layer 150E shown in FIG. 10 is disposed at the top surface and the side surface of a light-emitting structure 110, at the side surfaces of second and third passivation layers 180 and 182, at the top surface of the second passivation layer 180, between the bottom surface of the third passivation layer 182 and the top surface of the (2-1)th electrode 140F-1, and between the bottom surface of the third passivation layer 182 and the top surface of the (2-2)th electrode 140F-2.

In the light-emitting devices 100G to 100J shown in FIGS. 7 to 10, the (1-1)th electrodes 120E-1 and 120F-1 and the first bonding layers 130E-1 and 130F-1 are shown as having the same width, and the (1-2)th electrodes 120E-2 and 120F-2 and the second bonding layers 130E-2 and 130F-2 are shown as having the same width. However, the disclosure is not limited thereto.

FIG. 11 is a sectional view showing a light-emitting device 100K according to still another embodiment.

In the light-emitting device 100K shown in FIG. 11, a molding layer 150F is disposed only at the top surface and the side surface of a light-emitting structure 110 and the top surface of a second passivation layer 180, unlike the light-emitting device 100J shown in FIG. 10. The light-emitting device 100K shown in FIG. 11 is identical to the light-emitting device 100J shown in FIG. 10 except for the differences described above, and therefore a duplicate description will be omitted.

FIG. 12 is a sectional view showing a light-emitting device 100L according to a still another embodiment.

In the light-emitting device 100L shown in FIG. 12, a molding layer 150G is disposed at the top surface and the side surface of a light-emitting structure 110, at the top surface and the side surface of a second passivation layer 180, at the side surface of a third passivation layer 182, between the bottom surface of the third passivation layer 182 and the top surface of a (2-1)th electrode 140F-1, between the bottom surface of the third passivation layer 182 and the top surface of a (2-2)th electrode 140F-2, and at the side surfaces of the (2-1)th and (2-2)th electrodes 140F-1 and 140F-2, unlike the light-emitting device 100K shown in FIG. 11. The light-emitting device 100L shown in FIG. 12 is identical to the light-emitting device 100K shown in FIG. 11 except for the differences in disposition of the molding layer 150G described above, and therefore a duplicate description will be omitted.

Hereinafter, light-emitting device arrays according to embodiments will be described with reference to the accompanying drawings. A plurality of light-emitting devices included in each light-emitting device array may be electrically connected to each other. In the following description, each light-emitting device array includes only two light-emitting devices, for the sake of convenience. However, the disclosure is not limited thereto. Each light-emitting device array may include three or more light-emitting devices.

FIG. 13a is a plan view showing a light-emitting device array 200A according to an embodiment, and FIG. 13b is a sectional view taken along line A-A' of the light-emitting device array 200A shown in FIG. 13a.

As shown in FIGS. 13a and 13b, the light-emitting device array 200A may include two adjacent first and second light-emitting devices 100B-1 and 100B-2. The first and second light-emitting devices 100B-1 and 100B-2 may be connected to each other in series.

Referring to FIGS. 13a and 13b, the first light-emitting device 100B-1 includes a light-emitting structure 110-1, (1-1)th, (1-2)th, (2-1)th, and (2-2)th electrodes 120B1-1, 120B1-2, 140B1-1, and 140B1-2, first and second bonding layers 130B1-1 and 130B1-2, and a molding layer 150H, and the second light-emitting device 100B-2 includes a light-emitting structure 110-2, (1-1)th, (1-2)th, (2-1)th, and (2-2)th electrodes 120B2-1, 120B2-2, 140B2-1, and 140B2-2, first and second bonding layers 130B2-1 and 130B2-2, and a molding layer 150H. For the convenience of description, the molding layers 150H shown in FIG. 13b are omitted from FIG. 13a.

The light-emitting structures 110-1 and 110-2, the (1-1)th electrodes 120B1-1 and 120B2-1, the (1-2)th electrodes 120B1-2 and 120B2-2, the (2-1)th electrodes 140B1-1 and 140B2-1, the (2-2)th electrodes 140B1-2 and 140B2-2, the first bonding layers 130B1-1 and 130B2-1, the second bonding layers 130B1-2 and 130B2-2, and the molding layers 150H of the first and second light-emitting devices 100B-1 and 100B-2 correspond to the light-emitting structure 110, the (1-1)th electrode 120B-1, the (1-2)th electrode 120B-2, the (2-1)th electrode 140B-1, the (2-2)th electrode 140B-2, the first bonding layer 130B-1, the second bonding layer 130B-2, and the molding layer 150B shown in FIG. 2, respectively, and therefore a duplicate description will be omitted.

Referring to FIGS. 13a and 13b, the (2-2)th electrode 140B1-2 of the first light-emitting device 100B-1 and the (2-1)th electrode 140B2-1 of the second light-emitting device 100B-2, which is adjacent to the first light-emitting device 100B-1 among the plurality of light-emitting devices, may be integrated. Thus, the degree of integration of the light-emitting device array 200A may have more improved when the (2-2)th electrode 140B1-2 and the (2-1)th electrode 140B2-1 are integrated than when the (2-2)th electrode 140B1-2 and the (2-1)th electrode 140B2-1 are separate from each other. In the case in which a first conductive type is an n type and a second conductive type is a p type, therefore, the anode p of the first light-emitting device 100B-1 and the cathode n of the second light-emitting device 100B-2 may be electrically connected to each other.

FIG. 14a is a plan view showing a light-emitting device array 200B according to still another embodiment, and FIG. 14b is a sectional view taken along line A-A' of the light-emitting device array 200B shown in FIG. 14a. For the convenience of description, molding layers 150H shown in FIG. 14b are omitted from FIG. 14a.

Referring to FIGS. 14a and 14b, a (2-1)th electrode 140B1-1 of a first light-emitting device 100B-1 and a (2-2)th electrode 140B2-2 of a second light-emitting device 100B-2 are integrated, and a (2-2)th electrodes 140B1-2 of the first light-emitting device 100B-1 and a (2-1)th electrodes 140B2-1 of the second light-emitting device 100B-2 are integrated, unlike the light-emitting device array 200A shown in FIGS. 13a and 13b. Thus, the degree of integration of the light-emitting device array 200B may have more improved when the (2-1)th electrode 140B1-1 and the (2-2)th electrode 140B2-2 are integrated and when the (2-2)th electrode 140B1-2 and the (2-1)th electrode 140B2-1 are integrated than either when the (2-1)th electrode 140B1-1 and the (2-2)th electrode 140B2-2 are separated from each other or when the (2-2)th electrode 140B1-2 and the (2-1)th electrode 140B2-1 are separated from each other. In the case in which a first conductive type is an n type and a second conductive type is a p type, therefore, the cathode n of the first light-emitting device 100B-1 and the anode p of the second light-emitting device 100B-2 may be electrically connected to each other, and the anode p of the first light-emitting device 100B-1 and the cathode n of the second light-emitting device 100B-2 may be electrically connected to each other. Consequently, the first or second light-emitting device 100B-1 or 100B-2 included in the light-emitting device array 200B shown in FIGS. 14a and 14b may serve as a Zener diode.

The light-emitting device array 200B shown in FIGS. 14a and 14b is identical to the light-emitting device array 200A shown in FIGS. 13a and 13b except for the differences described above, and therefore a duplicate description will be omitted.

FIG. 15a is a plan view showing a light-emitting device array 200C according to still another embodiment, and FIG. 15b is a sectional view taken along line A-A' of the light-emitting device array 200C shown in FIG. 15a. For the convenience of description, molding layers 150H shown in FIG. 15b are omitted from FIG. 15a.

Referring to FIGS. 15a and 15b, a (2-1)th electrode 140B1-1 of a first light-emitting device 100B-1 and a (2-1)th electrode 140B2-1 of a second light-emitting device 100B-2 are integrated, and a (2-2)th electrode 140B1-2 of the first light-emitting device 100B-1 and a (2-2)th electrode 140B2-2 of the second light-emitting device 100B-2 are integrated, unlike the light-emitting device array 200A shown in FIGS. 13a and 13b. Thus, the degree of integration of the light-emitting device array 200C may have more improved when the (2-1)th electrodes 140B1-1 and 140B2-1 are integrated and when the (2-2)th electrodes 140B1-2 and 140B2-2 are integrated than either when the (2-1)th electrodes 140B1-1 and 140B2-1 are separated from each other and when the (2-2)th electrodes 140B1-2 and 140B2-2 are separated from each other. In the case in which a first conductive type is an n type and a second conductive type is a p type, therefore, the cathodes n of the first and second light-emitting devices 100B-1 and 100B-2 may be electrically connected to each other, and the anodes p of the first and second light-emitting devices 100B-1 and 100B-2 may be electrically connected to each other. Consequently, the first and second light-emitting devices 100B-1 and 100B-2 included in the light-emitting device array 200C shown in FIGS. 15a and 15b may be connected to each other in parallel.

The light-emitting device array 200C shown in FIGS. 15a and 15b is identical to the light-emitting device array 200A shown in FIGS. 13a and 13b except for the differences described above, and therefore a duplicate description will be omitted.

FIG. 16 is a sectional view showing a light-emitting device array 200D according to a still another embodiment.

In FIGS. 13a to 15b, each of the first and second light-emitting devices 100B-1 and 100B-2 corresponds to the light-emitting device 100B shown in FIG. 2. However, the disclosure is not limited thereto. That is, in another embodiment, the light-emitting devices 100A and 100C to 100L shown in FIGS. 1 and 3 to 12 may be connected as shown in FIGS. 13a to 15b.

For example, referring to FIG. 16, the light-emitting device array 200D may include two adjacent first and second light-emitting devices 100M-1 and 100M-2, which are connected to each other in series.

Referring to FIG. 16, the first light-emitting device 100M-1 includes a light-emitting structure 110-1, (1-1)th, (1-2)th, (2-1)th, and (2-2)th electrodes 120E1-1, 120E1-2, 140E1-1, and 140E1-2, first and second bonding layers 130E1-1 and 130E1-2, a molding layer 150I-1, second and third passivation layers 180-1 and 182-1, a second conductive electrode 170-1, and a first conductive electrode 190-1. The second light-emitting device 100M-2 includes a light-emitting structure 110-2, (1-1)th, (1-2)th, (2-1)th, and (2-2)th electrodes 120E2-1, 120E2-2, 140E2-1, and 140E2-2, first and second bonding layers 130E2-1 and 130E2-2, a molding layer 150I-2, second and third passivation layers 180-2 and 182-2, a second conductive electrode 170-2, and a first conductive electrode 190-2.

The light-emitting structures 110-1 and 110-2, the (1-1)th electrodes 120E1-1 and 120E2-1, the (1-2)th electrodes 120E1-2 and 120E2-2, the (2-1)th electrodes 140E1-1 and 140E2-1, the (2-2)th electrodes 140E1-2 and 140E2-2, the first bonding layers 130E1-1 and 130E2-1, the second bonding layers 130E1-2 and 130E2-2, the second passivation layers 180-1 and 180-2, the third passivation layers 182-1 and 182-2, the second conductive electrodes 170-1 and 170-2, and the first conductive electrodes 190-1 and 190-2 of the first and second light-emitting devices 100M-1 and 100M-2 correspond to the light-emitting structure 110, the (1-1)th electrode 120E-1, the (1-2)th electrode 120E-2, the (2-1)th electrode 140E-1, the (2-2)th electrode 140E-2, the first bonding layer 130E-1, the second bonding layer 130E-2, the second passivation layer 180, the third passivation layer 182, the second conductive electrode 170, and the first conductive electrode 190 shown in FIG. 7, respectively, and therefore a duplicate description will be omitted. However, the light-emitting devices 100M-1 and 100M-2 of the light-emitting device array 200D shown in FIG. 16 include the molding layers 150I-1 and 150I-2, respectively, unlike the light-emitting device 100G shown in FIG. 7. Each of the molding layers 150I-1 and 150I-2 is disposed in the same manner as the molding layer 150F shown in FIG. 9 or 11. However, the disclosure is not limited thereto. That is, in another embodiment, each of the molding layers 150I-1 and 150I-2 may be disposed in the same manner as shown in FIG. 10 or 12.

In addition, in the light-emitting devices 100M-1 and 100M-2 of the light-emitting device array 200D shown in FIG. 16, the first width W1 of the light-emitting structures 110-1 and 110-2 is less than the second width W2, represented by Equation 1 above, unlike the light-emitting device 100G shown in FIG. 7.

The first and second light-emitting devices 100M-1 and 100M-2 shown in FIG. 16 are connected to each other in series as shown in FIGS. 13a and 13b. That is, the (1-2)th electrode 120E1-2 of the first light-emitting device 100M-1 and the (1-1)th electrode 120E2-1 of the second light-emitting device 100M-2 are integrated, the second bonding layer 130E1-2 of the first light-emitting device 100M-1 and the first bonding layer 130E2-1 of the second light-emitting device 100M-2 are integrated, and the (2-2)th electrode 140E1-2 of the first light-emitting device 100M-1 and the (2-1)th electrode 140E2-1 of the second light-emitting device 100M-2 are integrated. Thus, the degree of integration of the light-emitting device array 200D may have more improved when the (1-2)th electrode 120E1-2 and the (1-1)th electrode 120E2-1 are integrated and when the (2-2)th electrode 140E1-2 and the (2-1)th electrode 140E2-1 are integrated than either when the (1-2)th electrode 120E1-2 and the (1-1)th electrode 120E2-1 are separated from each other or when the (2-2)th electrode 140E1-2 and the (2-1)th electrode 140E2-1 are separated from each other. In the case in which a first conductive type is an n type and a second conductive type is a p type, therefore, the anode p of the first light-emitting device 100M-1 and the cathode n of the second light-emitting device 100M-2 may be electrically connected to each other.

Hereinafter, methods of manufacturing the above light-emitting devices will be described with reference to the accompanying drawings. However, the disclosure is not limited thereto. That is, the above light-emitting devices may be manufactured using other different methods.

FIGS. 17a to 17e are process sectional views illustrating a method of manufacturing the light-emitting device 100B shown in FIG. 2.

Referring to FIG. 17a, a light-emitting structure 110, a (1-1)th electrode 120B-1, and a (1-2)th electrode 120B-2 are formed on an upper substrate 210 in each of first and second areas A1 and A2. The upper substrate 210 may be formed of at least one selected from among sapphire (Al2O3), SiC, GaAs, GaN, ZnO, Si, GaP, InP, and Ge. However, the disclosure is not limited thereto. In addition, the upper substrate 210 may have a mechanical strength sufficient to be easily divided into individual chips through a scribing process and a breaking process without causing an entire nitride semiconductor to be curved.

In addition, a (2-1)th electrode 140B-1 is formed on a lower substrate 220 in the first area A1, a (2-2)th electrode 140B-2 is formed on the lower substrate 220 in the second area A2, and an electrode material layer 140B is formed on the lower substrate 220 over the first and second areas A1 and A2. The electrode material layer 140B corresponds to a (2-2)th electrode in the first area A1 and, at the same time, corresponds to a (2-1)th electrode in the second area A2.

The lower substrate 220 may be a semiconductor substrate formed of AlN, BN, silicon carbide (SiC), GaN, GaAs, Si, or the like. However, the disclosure is not limited thereto. The lower substrate 220 may be formed of a semiconductor material exhibiting thermal properties. Subsequently, the upper substrate 210, the light-emitting structure 110, the (1-1)th electrode 120B-1, and the (1-2)th electrode 120B-2 are turned upside down.

In addition, a sacrificial layer (not shown) formed of ITO may be further formed between the lower substrate 220 and the (2-1)th electrode 140A-1 and between the lower substrate 220 and the (2-2)th electrode 140A-2.

Subsequently, referring to FIG. 17b, the (1-1)th electrode 120B-1 and the (2-1)th electrode 140B-1 are bonded to each other using a first bonding layer 130B-1 in the first area A1, the (1-2)th electrode 120B-2 and the (2-2)th electrode 140B-2 are bonded to each other using a second bonding layer 130B-2 in the second area A2, the (1-2)th electrode 120B-2 and the electrode material layer 140B are bonded to each other using the second bonding layer 130B-2 in the first area A1, and the (1-1)th electrode 120B-1 and the electrode material layer 140B are bonded to each other using the first bonding layer 130B-1 in the second area A2.

Subsequently, referring to FIG. 17c, the upper substrate 210 is removed. When the upper substrate 210 is removed, the light-emitting structure 110 may be divided into the first and second areas A1 and A2 while a roughness portion 118 is formed on the light-emitting structure 110.

Subsequently, referring to FIG. 17d, a molding layer 150B is formed at at least some selected from among the light-emitting structure 110, the (1-1)th electrode 120B-1, the (1-2)th electrode 120B-2, the (2-1)th electrode 140B-1 and 140B, and the (2-2)th electrode 140B and 140B-2 in each of the first and second areas A1 and A2. The molding layer 150B may or may not include a fluorescent substance layer.

Subsequently, referring to FIG. 17e, the molding layer 150B is divided into the first and second areas A1 and A2 while the lower substrate 220 is removed, whereby a plurality of light-emitting devices is manufactured.

FIGS. 18a to 18e are process sectional views illustrating a method of manufacturing the light-emitting device 100C shown in FIG. 3. Hereinafter, a description will be given of a method of manufacturing the light-emitting device 100C shown in FIG. 3 in the case in which the light-emitting device 100C includes a molding layer 150J.

Referring to FIG. 18a, a light-emitting structure 110, a (1-1)th electrode 120C-1, and a (1-2)th electrode 120C-2 are formed on an upper substrate 210 in each of first and second areas A1 and A2. At the same time, a (2-1)th electrode 140C-1 and a (2-2)th electrode 140C-2 are formed on a lower substrate 220 in each of the first and second areas A1 and A2. Subsequently, the upper substrate 210, the light-emitting structure 110, the (1-1)th electrode 120C-1, and the (1-2)th electrode 120C-2 are turned upside down.

Subsequently, referring to FIG. 18b, the (1-1)th electrode 120C-1 and the (2-1)th electrode 140C-1 are bonded to each other using a first bonding layer 130C-1, and the (1-2)th electrode 120C-2 and the (2-2)th electrode 140C-2 are bonded to each other using a second bonding layer 130C-2, in each of the first and second areas A1 and A2.

Subsequently, referring to FIG. 18c, the upper substrate 210 is removed. When the upper substrate 210 is removed, a roughness portion 118 is formed on the light-emitting structure 110.

Subsequently, referring to FIG. 18d, a molding layer 150J is formed at at least some selected from among the light-emitting structure 110, the (1-1)th electrode 120C-1, the (1-2)th electrode 120C-2, the (2-1)th electrode 140C-1, and the (2-2)th electrode 140C-2 in each of the first and second areas A1 and A2. The molding layer 150J may or may not include a fluorescent substance layer.

Subsequently, referring to FIG. 18e, the molding layer 150J is divided into the first and second areas A1 and A2 while the lower substrate 220 is removed, whereby a plurality of light-emitting devices is manufactured.

FIGS. 19a to 19e are process sectional views illustrating a method of manufacturing the light-emitting device 100D shown in FIG. 4. Hereinafter, a description will be given of a method of manufacturing the light-emitting device 100D shown in FIG. 4 in the case in which the light-emitting device 100D includes a molding layer 150K.

Referring to FIG. 19a, a light-emitting structure 110, a (1-1)th electrode 120D-1, and a (1-2)th electrode 120D-2 are formed on an upper substrate 210 in each of first and second areas A1 and A2. At the same time, a (2-1)th electrode 140D-1 and a (2-2)th electrode 140D-2 are formed on a lower substrate 220 in each of the first and second areas A1 and A2. Subsequently, the upper substrate 210, the light-emitting structure 110, the (1-1)th electrode 120D-1, and the (1-2)th electrode 120D-2 are turned upside down.

Subsequently, referring to FIG. 19b, the (1-1)th electrode 120D-1 and the (2-1)th electrode 140D-1 are bonded to each other using a first bonding layer 130D-1, and the (1-2)th electrode 120D-2 and the (2-2)th electrode 140D-2 are bonded to each other using a second bonding layer 130D-2, in each of the first and second areas A1 and A2.

Subsequently, referring to FIG. 19c, the upper substrate 210 is removed. When the upper substrate 210 is removed, the light-emitting structure 110 may be divided into the first and second areas A1 and A2 while a roughness portion 118 is formed on the light-emitting structure 110.

Subsequently, referring to FIG. 19d, a molding layer 150K is formed at at least some selected from among the light-emitting structure 110, the (1-1)th electrode 120D-1, the (1-2)th electrode 120D-2, the (2-1)th electrode 140D-1, and the (2-2)th electrode 140D-2 in each of the first and second areas A1 and A2. The molding layer 150K may or may not include a fluorescent substance layer.

Subsequently, referring to FIG. 19e, the molding layer 150K is divided into the first and second areas A1 and A2 while the lower substrate 220 is removed, whereby a plurality of light-emitting devices is manufactured.

FIGS. 20a to 20e are process sectional views illustrating a method of manufacturing the light-emitting device 100H or 100I shown in FIG. 8 or 9.

Referring to FIG. 20a, a light-emitting structure 110, a second conductive electrode 170, a second passivation layer 180, a first conductive electrode 190, a third passivation layer 182, a (1-1)th electrode 120E-1, and a (1-2)th electrode 120E-2 are formed on an upper substrate 210 in each of first and second areas A1 and A2. At the same time, a (2-1)th electrode 140E-1 and a (2-2)th electrode 140E-2 are formed on a lower substrate 220 in each of the first and second areas A1 and A2. Subsequently, the upper substrate 210, the light-emitting structure 110, the second conductive electrode 170, the second passivation layer 180, the first conductive electrode 190, the third passivation layer 182, the (1-1)th electrode 120E-1, and the (1-2)th electrode 120E-2 are turned upside down.

Subsequently, referring to FIG. 20b, the (1-1)th electrode 120E-1 and the (2-1)th electrode 140E-1 are bonded to each other using a first bonding layer 130E-1, and the (1-2)th electrode 120E-2 and the (2-2)th electrode 140E-2 are bonded to each other using a second bonding layer 130E-2, in each of the first and second areas A1 and A2.

Subsequently, referring to FIG. 20c, the upper substrate 210 is removed. When the upper substrate 210 is removed, a roughness portion 118 is formed on the light-emitting structure 110.

Subsequently, referring to FIG. 20d, the light-emitting structure 110 is divided into the first and second areas A1 and A2.

Subsequently, referring to FIG. 20e, the lower substrate 220 is removed. Subsequently, molding layers 150C and 150D are formed on the resultant structure shown in FIG. 20e, whereby the light-emitting device 100H or 100I shown in FIG. 8 or 9 is manufactured. Each of the molding layers 150C and 150D may or may not include a fluorescent substance layer.

FIGS. 21a to 21e are process sectional views illustrating a method of manufacturing the light-emitting devices 100J, 100K, and 100L shown in FIGS. 10 to 12.

Referring to FIG. 21a, a light-emitting structure 110, a second conductive electrode 170, a second passivation layer 180, a first conductive electrode 190, a third passivation layer 182, a (1-1)th electrode 120F-1, and a (1-2)th electrode 120F-2 are formed on an upper substrate 210 in each of first and second areas A1 and A2. At the same time, a (2-1)th electrode 140F-1 is formed on a lower substrate 220 in the first area A1, a (2-2)th electrode 140F-2 is formed on the lower substrate 220 in the second area A2, and an electrode material layer 140F is formed on the lower substrate 220 over the first and second areas A1 and A2. Subsequently, the upper substrate 210, the light-emitting structure 110, the second conductive electrode 170, the second passivation layer 180, the first conductive electrode 190, the third passivation layer 182, the (1-1)th electrode 120F-1, and the (1-2)th electrode 120F-2 are turned upside down.

Subsequently, referring to FIG. 21b, the (1-1)th electrode 120F-1 and the (2-1)th electrode 140F-1 are bonded to each other using a first bonding layer 130F-1 in the first area A1, the (1-2)th electrode 120F-2 and the (2-2)th electrode 140F-2 are bonded to each other using a second bonding layer 130F-2 in the second area A2, the (1-2)th electrode 120F-2 and the electrode material layer 140F are bonded to each other using the second bonding layer 130F-2 in the first area A1, and the (1-1)th electrode 120F-1 and the electrode material layer 140F are bonded to each other using the first bonding layer 130F-1 in the second area A2.

Figure 21C:
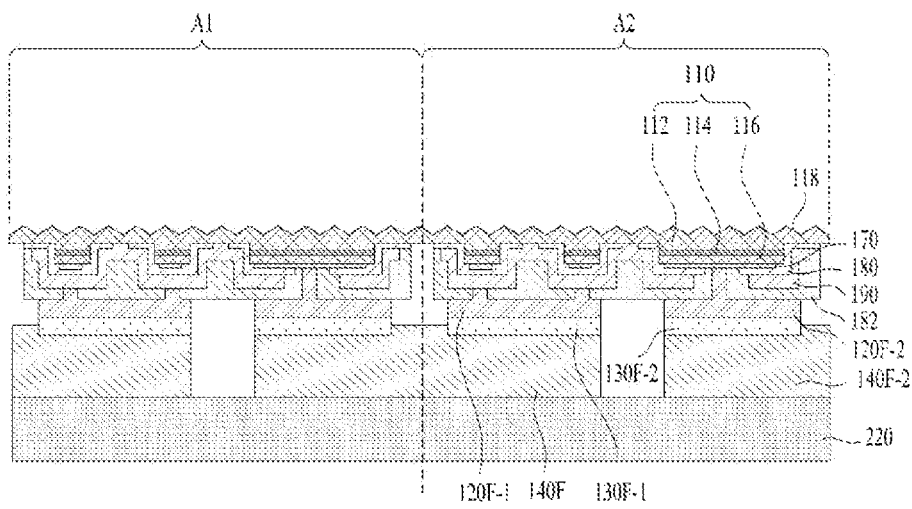

Subsequently, referring to FIG. 21c, the upper substrate 210 is removed. When the upper substrate 210 is removed, a roughness portion 118 is formed on the light-emitting structure 110.

Figure 21D:
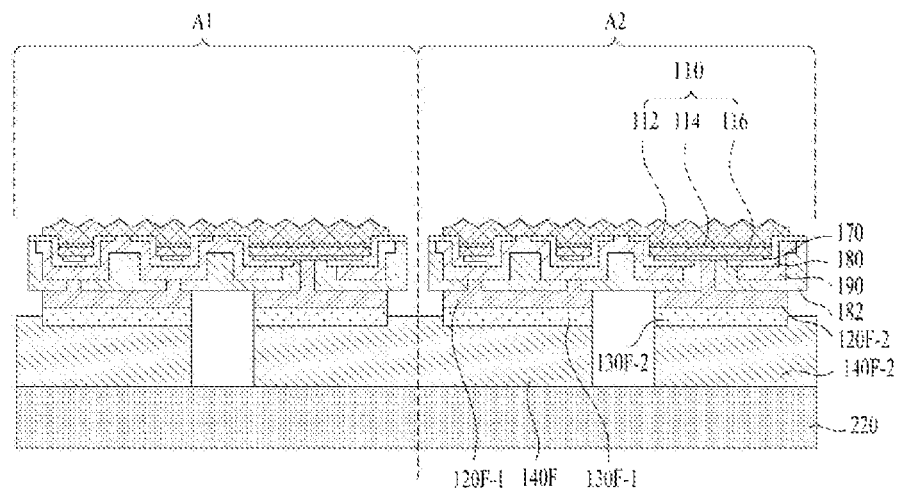

Subsequently, referring to FIG. 21d, the light-emitting structure 110 is divided into the first and second areas A1 and A2.

Figure 21E:
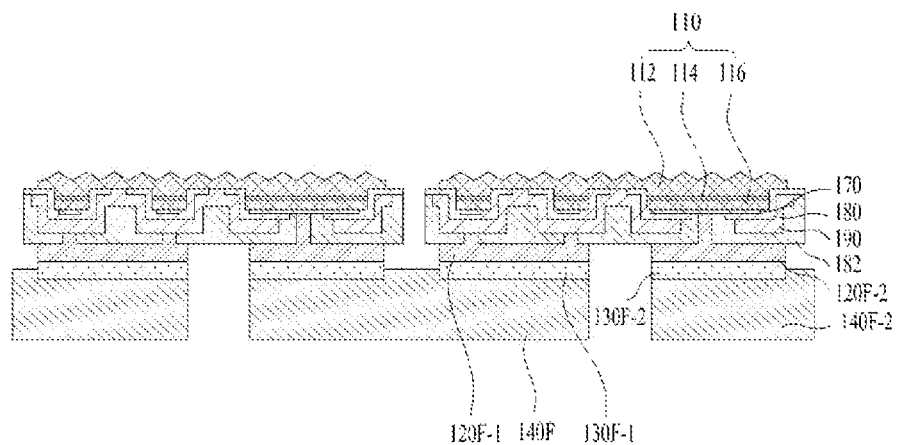

Subsequently, referring to FIG. 21e, the lower substrate 220 is removed, and the first and second areas A1 and A2 are divided from each other. Subsequently, molding layers 150E, 150F, and 150G are formed, whereby the light-emitting devices 100J, 100K, and 100L shown in FIGS. 10 to 12 are manufactured.

Hereinafter, a method of manufacturing a light-emitting device array according to an embodiment will be described with reference to the accompanying drawings. However, the disclosure is not limited thereto. That is, the light-emitting device array may be manufactured using various other methods.

FIGS. 22A to 22E are process sectional views illustrating a method of manufacturing the light-emitting device array 200D shown in FIG. 16.

Figure 22A:
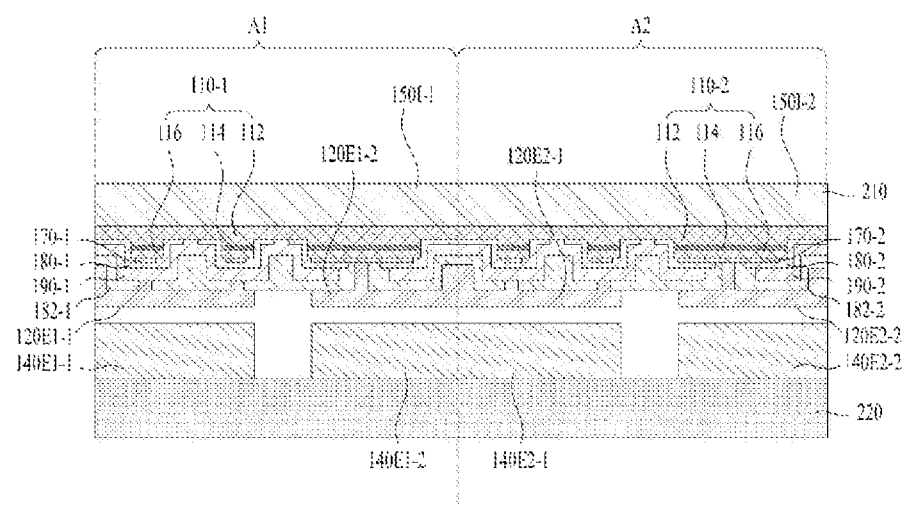
FIG. 22 shows are process sectional views illustrating a method of manufacturing the light-emitting device array shown in FIG. 16.

Referring to FIG. 22a, a light-emitting structure 110-1, a second conductive electrode 170-1, a second passivation layer 180-1, a first conductive electrode 190-1, a third passivation layer 182-1, a (1-1)th electrode 120E1-1, and a (1-2)th electrode 120E1-2 are formed on an upper substrate 210 in a first area A1, and a light-emitting structure 110-2, a second conductive electrode 170-2, a second passivation layer 180-2, a first conductive electrode 190-2, a third passivation layer 182-2, a (1-1)th electrode 120E2-1, and a (1-2)th electrode 120E2-2 are formed on the upper substrate 210 in a second area A2. The (1-2)th electrode 120E1-2 in the first area A1 and the (1-1)th electrode 120E2-1 in the second area A2 may be simultaneously formed as a single layer.

At the same time, a (2-1)th electrode 140E1-1 and a (2-2)th electrode 140E1-2 are formed on a lower substrate 220 in the first area A1, and a (2-1)th electrode 140E2-1 and a (2-2)th electrode 140E2-2 are formed on the lower substrate 220 in the second area A2. At this time, the (2-2)th electrode 140E1-2 in the first area A1 and the (2-1)th electrode 140E2-1 in the second area A2 may be simultaneously formed as a single layer. Subsequently, the upper substrate 210, the light-emitting structures 110-1 and 110-2, the second conductive electrodes 170-1 and 170-2, the second passivation layers 180-1 and 180-2, the first conductive electrodes 190-1 and 190-2, the third passivation layers 182-1 and 182-2, the (1-1)th electrodes 120E1-1 and 120E2-1, and the (1-2)th electrodes 120E1-2 and 120E2-2 are turned upside down.

Figure 22B:
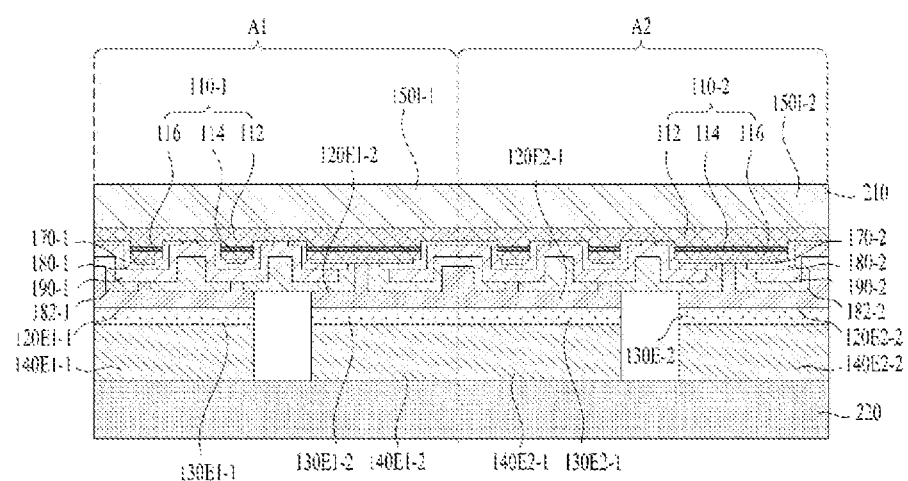

Subsequently, referring to FIG. 22b, the (1-1)th electrode 120E1-1 and the (2-1)th electrode 140E1-1 are bonded to each other using a first bonding layer 130E1-1 in the first area A1, and the (1-2)th electrode 120E2-2 and the (2-2)th electrode 140E2-2 are bonded to each other using a second bonding layer 130E2-2 in the second area A2. At this time, the (1-2)th electrode 120E1-2 and the (2-2)th electrode 140E1-2 are bonded to each other in the first area A1, and the (1-1)th electrode 120E2-1 and the (2-1)th electrode 140E2-1 are bonded to each other in the second area A2, using bonding layers 130E1-2 and 130E2-1 integrated over the first and second areas A1 and A2.

Figure 22C:
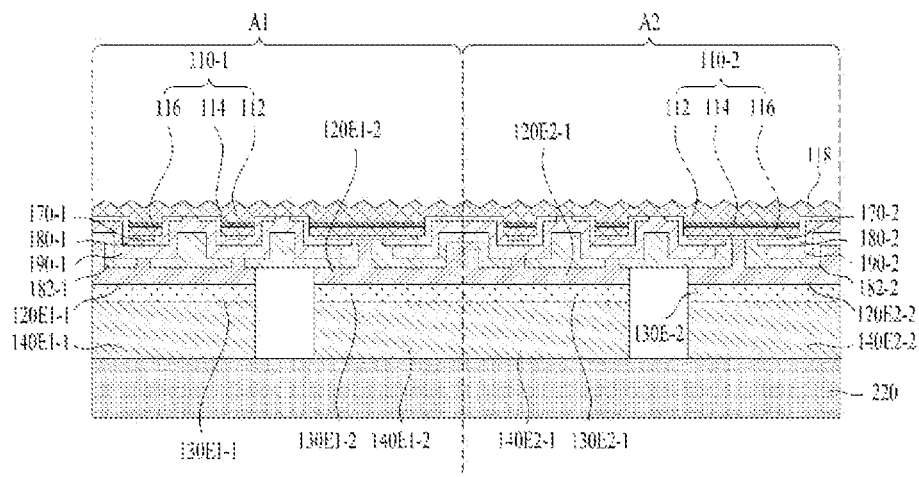

Subsequently, referring to FIG. 22c, the upper substrate 210 is removed. When the upper substrate 210 is removed, a roughness portion 118 is formed on the light-emitting structures 110-1 and 110-2.

Figure 22D:
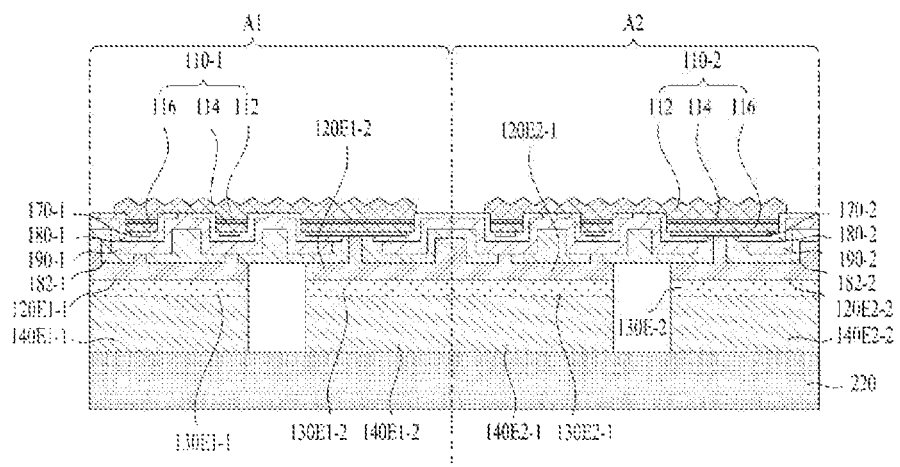

Subsequently, referring to FIG. 22d, the light-emitting structures 110-1 and 110-2 are divided into the first and second areas A1 and A2.

Figure 22E:
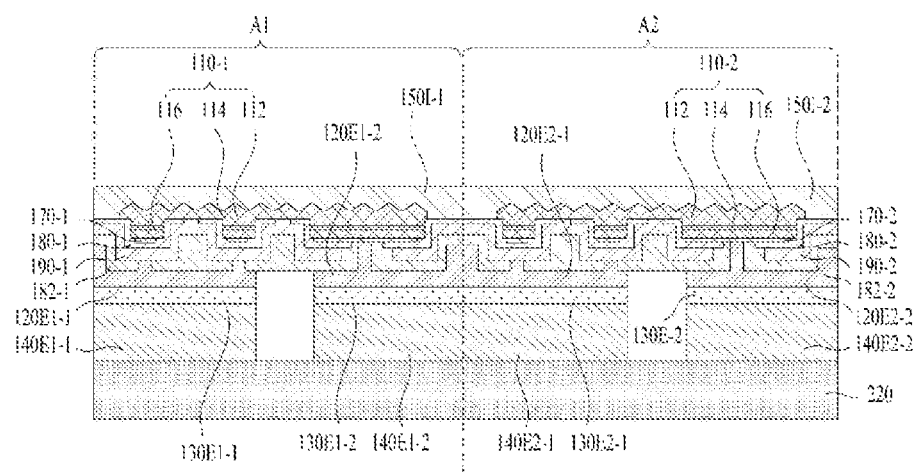

Subsequently, referring to FIG. 22e, molding layers 150I-1 and 150I-2 are formed on the resultant structure shown in FIG. 22d.

Subsequently, the lower substrate 220 is removed from the resultant structure shown in FIG. 22e, whereby the light-emitting device array 200D shown in FIG. 16 is manufactured.

A plurality of light-emitting device packages, each of which includes light-emitting devices or light-emitting device arrays according to embodiments, may be arrayed on a board. Optical members, such as a light guide plate, a prism sheet, and a diffusion sheet, may be disposed in a path of light emitted from the light-emitting device packages. The light-emitting device packages, the board, and the optical members may function as a backlight unit.

In addition, light-emitting device packages according to embodiments may be included in a light-emitting apparatus, such as a display apparatus, an indication apparatus, or a lighting apparatus.

The display apparatus may include a bottom cover, a reflection plate disposed on the bottom cover, a light-emitting module for emitting light, a light guide plate disposed in front of the reflection plate for guiding the light emitted by the light-emitting module forward, an optical sheet including prism sheets disposed in front of the light guide plate, a display panel disposed in front of the optical sheet, an image signal output circuit connected to the display panel for providing an image signal to the display panel, and a color filter disposed in front of the display panel. The bottom cover, the reflection plate, the light-emitting module, the light guide plate, and the optical sheet may constitute a backlight unit.

The lighting apparatus may include a light source module including a board and light-emitting device packages according to embodiments, a heat sink for dissipating heat generated from the light source module, and a power supply unit for processing or converting an electrical signal received from the outside and providing the processed or converted signal to the light source module. For example, a lighting apparatus may include a lamp, a head lamp, or a streetlight.

The head lamp may include a light-emitting module including light-emitting device packages disposed on a board, a reflector for reflecting light emitted by the light-emitting module in a predetermined direction, for example forward, a lens for refracting the light reflected by the reflector forward, and a shade for blocking or reflecting a portion of the light reflected by the reflector and directed to the lens to achieve a light distribution pattern desired by a designer.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

Various embodiments have been described in the best mode for carrying out the invention.

Light-emitting devices or light-emitting device arrays according to embodiments may be used in a light-emitting apparatus, such as a display apparatus, an indication apparatus, or a lighting apparatus.

The invention claimed is:

1. A light-emitting device array comprising:
a plurality of light-emitting devices connected to each other, each of the light-emitting devices comprising:
a light-emitting structure comprising a first conductive semiconductor layer, an active layer, and a second conductive semiconductor layer;
a (1-1)th electrode connected to the first conductive semiconductor layer exposed by mesa-etching the first conductive semiconductor layer, the active layer, and the second conductive semiconductor layer;
a (1-2)th electrode connected to the second conductive semiconductor layer;
a (2-1)th electrode connected to the (1-1)th electrode;
a (2-2)th electrodes connected to the (1-2)th electrode;
a first bonding layer disposed between the (1-1)th electrode and the (2-1)th electrode;
a second bonding layer disposed between the (1-2)th electrode and the (2-2)th electrode; and
a molding layer disposed so as to surround the light-emitting structure, the (1-1)th electrode, the (1-2)th electrode, the (2-1)th electrode, the (2-2)th electrode, the first bonding layer, and the second bonding layer,
wherein first and second light-emitting devices selected from among the plurality of light-emitting devices are adjacent to each other,
the (2-1)th electrode of the first light-emitting device and the (2-2)th electrode of the second light-emitting device are integrated, and
the (2-2)th electrode of the first light-emitting device and the (2-1)th electrode of the second light-emitting device are integrated,
wherein the (2-1)th electrode surrounds a bottom surface and a partial side surface of the first bonding layer,
wherein the (2-2)th electrode surrounds a bottom surface and a partial side surface of the second bonding layer,
wherein a horizontal spacing exists between the (1-1)th electrode and the (1-2)th electrode, and
wherein the light emitting structure includes a step portion at the horizontal spacing stepping from the (1-1)th electrode to the (1-2)th electrode.

2. The light-emitting device array according to claim 1, wherein the first bonding layer bonds the (1-1)th electrode and the (2-1)th electrode to each other by eutectic bonding, and
wherein the second bonding layer bonds the (1-2)th electrode and the (2-2)th electrode to each other by eutectic bonding.

3. The light-emitting device array according to claim 1, wherein a sum of thicknesses of the (1-1)th electrode, the (2-1)th electrode, and the first bonding layer is greater than a thickness of the light-emitting structure.

4. The light-emitting device array according to claim 1, wherein a sum of thicknesses of the (1-1)th electrode, the (2-1)th electrode, and the first bonding layer ranges from 10 µm to 500 µm.

5. The light-emitting device array according to claim 1, wherein a width of the (2-1)th electrode is equal to or greater than a width of the (1-1)th electrode, and wherein a width of the (2-2)th electrode is equal to or greater than a width of the (1-2)th electrode.

6. The light-emitting device array according to claim 1, wherein the (1-1)th electrode and the first bonding layer have a same width, and
wherein the (1-2)th electrode and the second bonding layer have a same width.

7. The light-emitting device array according to claim 1, further comprising a first passivation layer disposed on at least one selected from among the light-emitting structure, the (1-1)th and (1-2)th electrodes, the first and second bonding layers, and the (2-1)th and (2-2)th electrodes.

8. The light-emitting device array according to claim 1, wherein the step portion is disposed at a center portion of the horizontal spacing.

9. The light-emitting device array according to claim 1, wherein the (1-1)th electrode and the (1-2)th electrode extend beyond outermost edges of the light emitting structure, and
wherein the first bonding layer and the second bonding layer extend beyond the outermost edges of the light emitting structure.

10. A light-emitting device array, comprising:
a plurality of light-emitting devices connected to each other, each of the light-emitting devices comprising:
a light-emitting structure comprising a first conductive semiconductor layer, an active layer, and a second conductive semiconductor layer;
a (1-1)th electrode connected to the first conductive semiconductor layer exposed by mesa-etching the first conductive semiconductor layer, the active layer, and the second conductive semiconductor layer;
a (1-2)th electrode connected to the second conductive semiconductor layer;
a (2-1)th electrode connected to the (1-1)th electrode;
a (2-2)th electrode connected to the (1-2)th electrode;
a first bonding layer disposed between the (1-1)th electrode and the (2-1)th electrode;
a second bonding layer disposed between the (1-2)th electrode and the (2-2)th electrode; and
a molding layer disposed so as to surround the light-emitting structure, the (1-1)th electrode, the (1-2)th electrode, the (2-1)th electrode, the (2-2)th electrode, the first bonding layer, and the second bonding layer,
wherein first and second light-emitting devices selected from among the plurality of light-emitting devices are integrated,
the (2-1)th electrode of the first light-emitting device and the (2-1)th electrode of the second light-emitting device are integrated, and
the (2-2)th electrode of the first light-emitting device and the (2-2)th electrode of the second light-emitting device are integrated,
wherein the (2-1)th electrode surrounds a bottom surface and a side surface of the first bonding layer,
wherein the (2-2)th electrode surrounds a bottom surface and a side surface of the second bonding layer,
wherein a horizontal spacing exists between the (1-1)th electrode and the (1-2)th electrode, and
wherein the light emitting structure includes a step portion at the horizontal spacing stepping from the (1-1)th electrode to the (1-2)th electrode.

11. The light-emitting device array according to claim 10, wherein the first bonding layer bonds the (1-1)th electrode and the (2-1)th electrode to each other by eutectic bonding, and wherein the second bonding layer bonds the (1-2)th electrode and the (2-2)th electrode to each other by eutectic bonding, wherein a sum of thicknesses of the (1-1)th electrode, the (2-1)th electrode, and the first bonding layer is greater than a thickness of the light-emitting structure, and wherein a sum of thicknesses of the (1-1)th electrode, the (2-1)th electrode, and the first bonding layer ranges from 10 um to 500 μm.

12. The light-emitting device array according to claim 9, wherein the (2-1)th electrode surrounds the side surface of the first bonding layer extending beyond the outermost edges of the light emitting structure, and wherein the (2-2)th electrode surrounds the side surface of the second bonding layer extending beyond the outermost edges of the light emitting structure.

\* \* \* \* \*